US012175363B2

(12) United States Patent
Zuolo et al.

(10) Patent No.: US 12,175,363 B2
(45) Date of Patent: Dec. 24, 2024

(54) REGRESSION NEURAL NETWORK FOR IDENTIFYING THRESHOLD VOLTAGES TO BE USED IN READS OF FLASH MEMORY DEVICES

(71) Applicant: Microchip Technology Inc., Chandler, AZ (US)

(72) Inventors: Lorenzo Zuolo, Lusia (IT); Rino Micheloni, Turate (IT)

(73) Assignee: Microchip Technology Inc., Chandler, AZ (US)

( * ) Notice: Subject to any disclaimer, the term of this patent is extended or adjusted under 35 U.S.C. 154(b) by 962 days.

(21) Appl. No.: 17/089,891

(22) Filed: Nov. 5, 2020

(65) Prior Publication Data
US 2022/0027083 A1 Jan. 27, 2022

Related U.S. Application Data

(60) Provisional application No. 63/057,278, filed on Jul. 27, 2020.

(51) Int. Cl.
*G06N 3/08* (2023.01)
*G06F 3/06* (2006.01)
(Continued)

(52) U.S. Cl.
CPC .............. *G06N 3/08* (2013.01); *G06F 3/0679* (2013.01); *G06N 3/04* (2013.01); *G06N 5/04* (2013.01);
(Continued)

(58) Field of Classification Search
CPC ....... G06F 3/0679; G11C 11/54; G11C 16/26; G11C 29/021; G06N 20/00
(Continued)

(56) References Cited

U.S. PATENT DOCUMENTS 6,119,260 A 9/2000 Tomisawa et al.
6,567,313 B2 5/2003 Tanaka et al.
(Continued)

FOREIGN PATENT DOCUMENTS

WO 2020117348 A3 12/2020

OTHER PUBLICATIONS

Anonymous, "Training checkpoints | TensorFlow Core", Dec. 28, 2019, XP055886114, p. 1-p. 8, Retrieved from the Internet.
(Continued)

*Primary Examiner* — Kieu D Vu
*Assistant Examiner* — Broderick C Anderson
(74) *Attorney, Agent, or Firm* — Glass & Associates; Kenneth Glass

(57) ABSTRACT

A method and apparatus for reading a flash memory device are disclosed. A Regression Neural Network (RNN) inference model is stored on a flash controller. The RNN inference model is configured for identifying at least one Threshold-Voltage-Shift Read-Error (TVS-RE) curve that identifies a number of errors as a function of Threshold Voltage Shift Offset (TVSO) values. The operation of a flash memory device is monitored to identify usage characteristic values. A neural network operation of the RNN inference model is performed to generate a TVS-RE curve corresponding to the usage characteristic values. The input for the neural network operation includes the usage characteristic values. A TVSO value is identified corresponding to a minimum value of the TVS-RE curve. A read of the flash memory device is performed using a threshold-voltage-shift read at the TVSO value.

15 Claims, 14 Drawing Sheets

(51) Int. Cl.
  *G06N 3/04* (2023.01)
  *G06N 5/04* (2023.01)
  *G06N 20/00* (2019.01)
  *G11C 11/54* (2006.01)
  *G11C 16/26* (2006.01)

(52) U.S. Cl.
  CPC .............. *G11C 11/54* (2013.01); *G11C 16/26* (2013.01); *G06N 20/00* (2019.01)

(58) Field of Classification Search
  USPC .......................................................... 706/12
  See application file for complete search history.

(56) References Cited

U.S. PATENT DOCUMENTS

| | | |
|---|---|---|
| 6,704,871 B1 | 3/2004 | Kaplan et al. |
| 7,529,215 B2 | 5/2009 | Osterling et al. |
| 7,650,480 B2 | 1/2010 | Jiang |
| 7,930,623 B2 | 4/2011 | Pisek et al. |
| 8,429,325 B1 | 4/2013 | Onufryk et al. |
| 8,621,318 B1 | 12/2013 | Micheloni et al. |
| 8,656,257 B1 | 2/2014 | Micheloni et al. |
| 8,665,648 B2 | 3/2014 | Mun et al. |
| 8,689,074 B1 | 4/2014 | Tai |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,769,380 B1 | 7/2014 | Burd et al. |
| 8,966,335 B2 | 2/2015 | Lunelli et al. |
| 8,971,112 B2 | 3/2015 | Crippa et al. |
| 8,984,376 B1 | 3/2015 | Norrie |
| 8,990,661 B1 | 3/2015 | Micheloni et al. |
| 9,021,333 B1 | 4/2015 | Northcott |
| 9,092,353 B1 | 7/2015 | Micheloni et al. |
| 9,128,858 B1 | 9/2015 | Micheloni et al. |
| 9,235,467 B2 | 1/2016 | Micheloni et al. |
| 9,251,909 B1 | 2/2016 | Camp et al. |
| 9,268,531 B1 | 2/2016 | Woo et al. |
| 9,292,428 B2 | 3/2016 | Kanamori et al. |
| 9,305,661 B2 | 4/2016 | Micheloni et al. |
| 9,397,701 B1 | 7/2016 | Micheloni et al. |
| 9,417,804 B2 | 8/2016 | Micheloni et al. |
| 9,444,655 B2 | 9/2016 | Sverdlov et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,564,922 B1 | 2/2017 | Graumann et al. |
| 9,590,656 B2 | 3/2017 | Micheloni et al. |
| 9,747,200 B1 | 8/2017 | Micheloni |
| 9,799,405 B1 | 10/2017 | Micheloni et al. |
| 9,813,080 B1 | 11/2017 | Micheloni et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,216,422 B2 | 2/2019 | Kim et al. |
| 10,230,396 B1 | 3/2019 | Micheloni et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,490,288 B1 | 11/2019 | Wang et al. |
| 10,715,307 B1 | 7/2020 | Jin |
| 10,861,562 B1 | 12/2020 | Xiong et al. |
| 11,398,291 B2 | 7/2022 | Zuolo et al. |
| 11,514,994 B1 | 11/2022 | Zuolo et al. |
| 2002/0144210 A1 | 10/2002 | Borkenhagen et al. |
| 2006/0106743 A1 | 5/2006 | Horvitz |
| 2006/0161830 A1 | 7/2006 | Yedidia et al. |
| 2006/0282603 A1 | 12/2006 | Onufryk et al. |
| 2007/0076873 A1 | 4/2007 | Yamamoto et al. |
| 2007/0157064 A1* | 7/2007 | Falik .................. G06F 11/1012 714/755 |
| 2011/0231731 A1 | 9/2011 | Gross et al. |
| 2011/0255453 A1 | 10/2011 | Roh et al. |
| 2012/0166714 A1 | 6/2012 | Mun et al. |
| 2012/0287719 A1 | 11/2012 | Mun et al. |
| 2013/0343495 A1 | 12/2013 | Han et al. |
| 2014/0040697 A1 | 2/2014 | Loewenstein |
| 2014/0146605 A1 | 5/2014 | Yang |
| 2014/0237313 A1 | 8/2014 | Wang et al. |
| 2014/0281800 A1 | 9/2014 | Micheloni et al. |
| 2014/0281823 A1 | 9/2014 | Micheloni et al. |
| 2014/0310534 A1 | 10/2014 | Gurgi et al. |
| 2015/0033037 A1 | 1/2015 | Lidman |
| 2015/0049548 A1 | 2/2015 | Park et al. |
| 2015/0100860 A1 | 4/2015 | Lee et al. |
| 2016/0072527 A1 | 3/2016 | Suzuki et al. |
| 2016/0124679 A1* | 5/2016 | Huang ................ G06F 12/0223 711/103 |
| 2016/0247581 A1 | 8/2016 | Suzuki et al. |
| 2016/0266791 A1 | 9/2016 | Lin et al. |
| 2016/0371014 A1 | 12/2016 | Roberts |
| 2017/0133107 A1 | 5/2017 | Ryan et al. |
| 2017/0149446 A1 | 5/2017 | Tao et al. |
| 2017/0213597 A1 | 7/2017 | Micheloni |
| 2017/0263311 A1* | 9/2017 | Cometti ................ G06F 11/076 |
| 2018/0005670 A1 | 1/2018 | Lee et al. |
| 2018/0033490 A1 | 2/2018 | Marelli et al. |
| 2018/0046541 A1 | 2/2018 | Niu et al. |
| 2018/0314586 A1 | 11/2018 | Artieri et al. |
| 2019/0004734 A1 | 1/2019 | Kirshenbaum et al. |
| 2019/0073139 A1 | 3/2019 | Kim et al. |
| 2019/0087119 A1* | 3/2019 | Oh ....................... G11C 11/5642 |
| 2019/0095794 A1 | 3/2019 | López et al. |
| 2019/0317901 A1 | 10/2019 | Kachare et al. |
| 2020/0004455 A1 | 1/2020 | Williams et al. |
| 2020/0066361 A1* | 2/2020 | Ioannou ............... G06F 3/0679 |
| 2020/0074269 A1 | 3/2020 | Trygg et al. |
| 2020/0125955 A1 | 4/2020 | Klinger et al. |
| 2020/0151539 A1* | 5/2020 | Oh ........................... G06N 5/04 |
| 2020/0183826 A1 | 6/2020 | Beaudoin et al. |
| 2020/0184245 A1 | 6/2020 | Huang et al. |
| 2020/0185027 A1 | 6/2020 | Rom et al. |
| 2020/0210831 A1 | 7/2020 | Zhang et al. |
| 2021/0109673 A1 | 4/2021 | Kim et al. |
| 2021/0118137 A1 | 4/2021 | Shi et al. |
| 2021/0192333 A1 | 6/2021 | Thiruvengadam et al. |
| 2021/0385012 A1 | 12/2021 | Buethe et al. |
| 2021/0385682 A1 | 12/2021 | Bedekar et al. |
| 2022/0012121 A1* | 1/2022 | Xu ....................... G11C 29/021 |
| 2022/0050632 A1 | 2/2022 | Hong et al. |
| 2022/0051730 A1 | 2/2022 | Choi et al. |
| 2022/0058488 A1 | 2/2022 | Zuolo et al. |
| 2022/0116056 A1 | 4/2022 | Kaynak et al. |
| 2022/0129738 A1 | 4/2022 | Kale |
| 2022/0165348 A1 | 5/2022 | Zuolo et al. |
| 2022/0188604 A1 | 6/2022 | Zuolo et al. |
| 2022/0270698 A1 | 8/2022 | Zuolo et al. |
| 2022/0329262 A1 | 10/2022 | Liu et al. |
| 2022/0342582 A1 | 10/2022 | Graumann |
| 2022/0365845 A1 | 11/2022 | Buch et al. |
| 2022/0374169 A1 | 11/2022 | Zuolo et al. |
| 2022/0375532 A1 | 11/2022 | Zuolo et al. |
| 2022/0382629 A1 | 12/2022 | Graumann |
| 2022/0383970 A1 | 12/2022 | Zuolo et al. |
| 2022/0416812 A1 | 12/2022 | Wu |
| 2023/0087247 A1 | 3/2023 | Li et al. |

OTHER PUBLICATIONS

PCT/US2021/012105, International Search Report and Written Opinion of the International Searching Authority, European Patent Office, mailed on Mar. 24, 2021.

Noam Shazeer et al: Outrageously Large Neural Networks: The Sparsely-Gated Mixture-of-Experts Layer11 , arxiv .org, Cornell University Li Bra Ry, 201 Olin Li Bra Ry Cornell University Ithaca, NY 14853, Jan. 23, 2017.

Yu Cai et al, "Errors in Flash-Memory-Based Solid-State Drives: Analysis, Mitigation, and Recovery" 11 , arxiv.org, Cornell University Library, 201 Olin Library Cornell University Ithaca, NY 14853, Nov. 28, 2017.

(56) References Cited

OTHER PUBLICATIONS

U.S. Appl. No. 17/089,891, filed Nov. 5, 2020, Lorenzo Zuolo.
U.S. Appl. No. 17/148,200, filed Jan. 13, 2021, Lorenzo Zuolo.
U.S. Appl. No. 17/213,675, filed Mar. 26, 2021, Lorenzo Zuolo.
U.S. Appl. No. 63/057,278, filed Jul. 27, 2020, Lorenzo Zuolo.
U.S. Appl. No. 17/347,399, filed Jun. 14, 2021, Lorenzo Zuolo.
U.S. Appl. No. 17/398,091, filed Aug. 10, 2021, Lorenzo Zuolo.
U.S. Appl. No. 17/506,735, filed Oct. 21, 2021, Lorenzo Zuolo.
J. Mu et al., "The impact of faulty memory bit cells on the decoding of spatially-coupled LDPC codes," 2015 49th Asilomar Conference on Signals, Systems and Computers, Pacific Grove, CA, USA, 2015, pp. 1627-1631, doi: 10.1109/ACSSC .2015.7421423. (Year: 2015).

* cited by examiner

LIFETIME OF FLASH MEMORY DEVICE

REGRESSION NEURAL NETWORK FOR IDENTIFYING THRESHOLD VOLTAGES TO BE USED IN READS OF FLASH MEMORY DEVICES

CROSS-REFERENCE TO RELATED APPLICATIONS

The present application claims priority to U.S. Provisional Patent Application Ser. No. 63/057,278 filed on Jul. 27, 2020, the contents of which are incorporated by reference herein in their entirety.

BACKGROUND

The process of characterizing flash memory devices is expensive and time consuming. In addition, the characteristics of flash memory devices change during the lifetime of the flash memory devices, making accurate characterization difficult.

Standard read instructions (e.g., READ or READ PAGE instruction) perform a read of a memory cell at a default threshold voltage within each threshold voltage region required to define a bit of the memory cell. Single Level Cell (SLC) flash memory devices store a single bit of information in each cell and only require a read in a single threshold voltage region (the threshold voltage region is the region that extends between the center of the voltage distribution for a 1 and the center of the voltage distribution for a 0) to identify the value of a bit (whether the cell is storing a 1 or a 0). Multi-level cell (MLC) flash memory devices store two bits of information in each cell, triple level cell (TLC) flash memory devices store three bits of information in each cell and quad level cell (QLC) flash memory devices store four bits of information in each cell. MLC, TLC and QLC flash memory devices require reads at more than one threshold voltage to identify the value of a particular bit.

Some Solid State Drives (SSD's) use threshold-voltage-shift reads for reading flash memory devices to obtain low levels of Uncorrectable Bit Error Rate (UBER) required for client and enterprise SSD's. Threshold-voltage-shift reads are performed by sending a threshold-voltage-shift read instruction to a flash memory device that is to be read. One or more threshold-Voltage-Shift Offset (TVSO) value is sent with the threshold-voltage-shift read instruction. The TVSO value indicates the amount by which the threshold voltage that is used to perform the read is to be offset from a corresponding default threshold voltage that is specified by the manufacturer of the flash memory device. Threshold-voltage-shift read instructions for MLC, TLC and QLC flash memory devices include two or more TVSO values, one TVSO value for each threshold voltage region required to identify the particular bit being read.

For systems that use threshold-voltage-shift read instructions for reading flash memory devices, there is a need to identify TVSO values to be used in each read of a flash memory device so as to maintain UBER within acceptable levels during the lifetime of the SSD.

SUMMARY OF THE INVENTION

A method for reading a flash memory device is disclosed that includes storing a Regression Neural Network (RNN) inference model on a flash controller that is coupled to the flash memory device, the RNN inference model configured to identify at least one Threshold-Voltage-Shift Read-Error (TVS-RE) curve, each TVS-RE curve identifying a number of errors as a function of TVSO values. The operation of a flash memory device is monitored to identify one or more usage characteristic values of the flash memory device. Usage characteristic values are values that indicate the age and/or physical degradation of the flash memory device over time and values that indicate current transitory characteristics of the flash memory device or a particular structure (e.g., a wordline or a block) of the flash memory device. In one example, the number of program and erase cycles (P/E cycles) of the flash memory device or the number of P/E cycles of a particular structure (e.g., a wordline or a block) of the flash memory device is used as a usage characteristic value to indicate the age and/or physical degradation of the flash memory device over time.

A neural network operation of the stored RNN inference model is performed to generate a TVS-RE curve corresponding to the identified usage characteristic values. The input for the neural network operation includes the identified one or more usage characteristic values and one or more value identifying a page that is to be read. A TVSO value is then identified corresponding to a minimum value of the generated TVS-RE curve. A read of the flash memory device is performed using a threshold-voltage-shift read at the identified TVSO value.

An SSD is disclosed that includes a flash controller and a plurality of flash memory devices. The flash controller includes a write circuit, a read circuit configured to perform a read of a flash memory device using a threshold-voltage-shift read operation and a decoder configured to decode the results of the read. The flash controller includes a status circuit for monitoring the operation of the flash memory device to identify one or more usage characteristic values of the flash memory device and a data storage configured to store a RNN inference model. The RNN inference model is configured to identify at least one TVS-RE curve. Each TVS-RE curve identifies a number of errors as a function of TVSO values.

The flash controller further includes a neural processing module coupled to the data storage. The neural processing module is configured to perform a neural network operation of the stored RNN inference model to generate a TVS-RE curve corresponding to the identified usage characteristic values. The input for the neural network operation includes the identified one or more usage characteristic values and one or more value identifying a page that is to be read. The value identifying a page that is to be read may be a numerical value that identifies one or more of the wordline, block, plane and device that is to be read (i.e., it indicates the physical structure of the flash memory device that is to be read).

The flash controller includes a minimum function module coupled to the neural processing module. The minimum function module is configured to determine a minimum value for the generated TVS-RE curve and to identify a TVSO value corresponding to the determined minimum value. The threshold-voltage-shift read operation uses the identified TVSO value to perform the read.

The method and apparatus of the present invention models multiple factors that affect UBER and generates, on the flash controller, a TVS-RE curve that accurately reflects the physical characteristics of the location that is to be read, both the structural characteristics of the location that is to be read (e.g., the wordline and the block that is to be read), the current age/physical degradation of the location that is to be read (e.g., the number of P/E cycles) and the current transitory characteristics of the location that is to be read (e.g., closed-block read disturb and closed-block retention time). Because the generated TVS-RE curve accurately represents the factors that affect UBER, the generated TVSO value corresponding to the minimum value of the TVS-RE curve will be the appropriate TVSO value for performing the read (corresponding to the TVSO value that provides a minimum number of errors during device characterization). Using the appropriate TVSO value for performing the read results in a reduced number of read errors at the flash controller. The reduced number of read errors of the method and apparatus of the present invention effectively maintains UBER within acceptable levels during the lifetime of the SSD.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
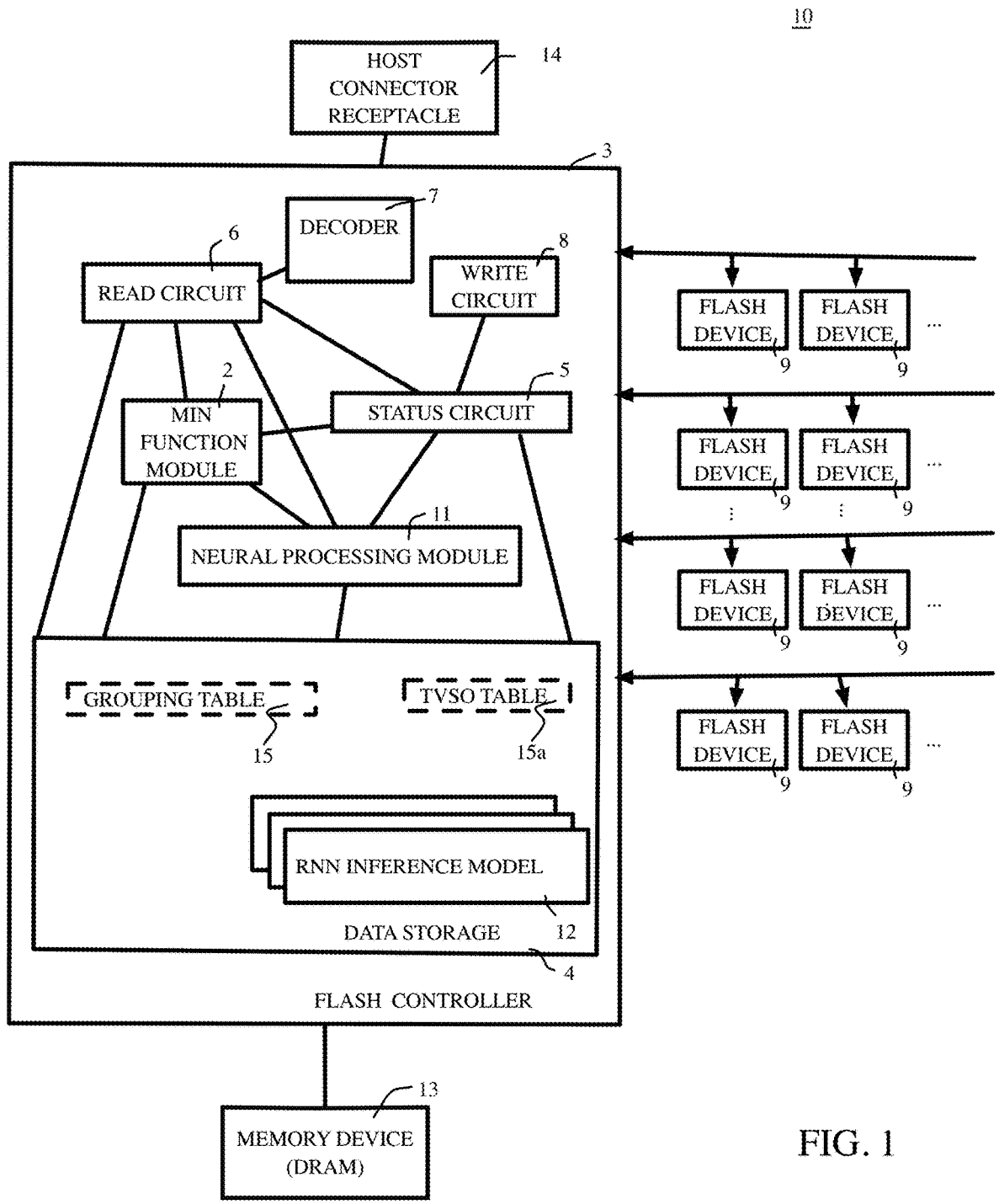
FIG. 1 is a block diagram illustrating a SSD in accordance with an embodiment of the present invention.

An SSD 10 is shown in FIG. 1 to include a flash controller 3 coupled to a plurality of flash memory devices 9 for storing data. In the present embodiment, the flash memory devices 9 are NAND devices and SSD 10 includes one or more circuit boards onto which a host connector receptacle 14, flash controller 3 and flash memory devices 9 are attached. SSD 10 may also include one or more memory device 13 such as a Dynamic Random Access Memory (DRAM), that may be a separate integrated circuit device attached to a circuit board on which flash controller 3 is mounted, and electrically coupled directly to flash controller 3.

Flash controller 3 is configured to receive read and write instructions from a host computer through host connector receptacle 14, and to perform program operations, erase operations and read operations on memory cells of flash memory devices 9 to complete the instructions from the host computer. For example, upon receiving a write instruction from the host computer via host connector receptacle 14, flash controller 3 is operable to store data in SSD 10 by performing program operations (and when required, erase operations) to program codewords into on one or more flash memory device 9.

Flash controller 3 includes a write circuit 8, a read circuit 6, a decoder 7, a status circuit 5 and a data storage 4. Flash controller 3 also includes a neural processing module 11 coupled to the data storage 4 and a minimum function module 2 coupled to neural processing module 11. Flash controller 3 may optionally include one or more table 15, 15a coupled to minimum function module 2, optionally included within data storage 4. Read circuit 6 is coupled to decoder 7, status circuit 5, minimum function module 2, data storage 4 and neural processing module 11. Status circuit 5 is coupled to write circuit 8, minimum function module 2, neural processing module 11 and data storage 4. One or more regression neural network (RNN) inference model 12 is included within data storage 4.

Figure 2:
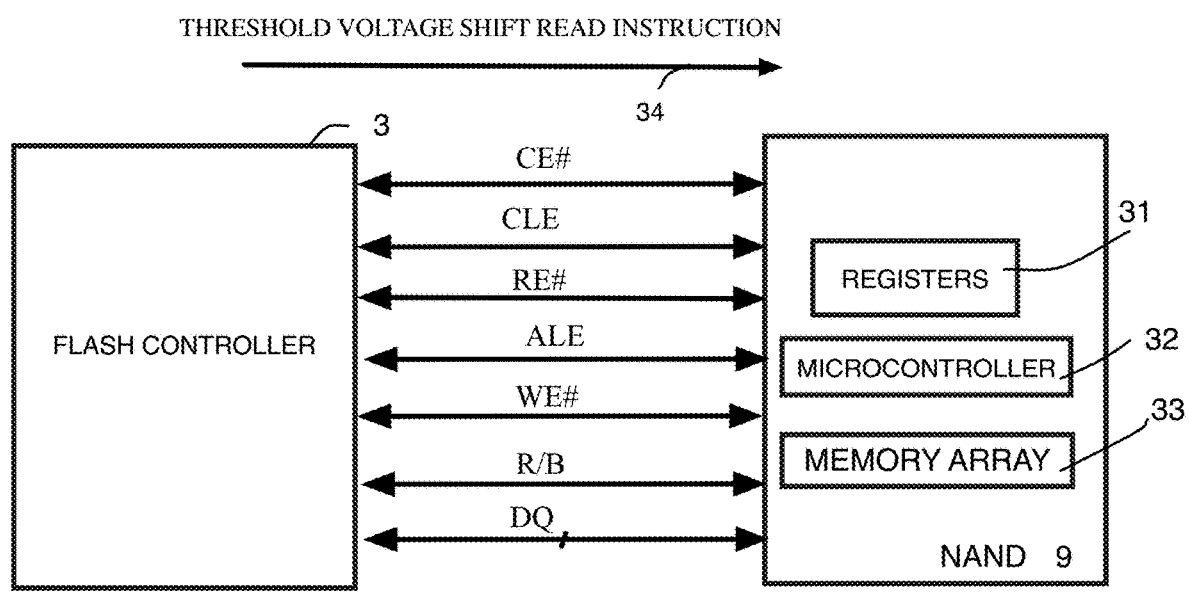
FIG. 2 is a diagram illustrating a flash controller and an exemplary NAND flash memory device and illustrates the communication between the flash controller and the flash memory device in accordance with an embodiment of the present invention.

Each flash memory device 9 may be a packaged semiconductor die or "chip" that is coupled to flash controller 3 by conductive pathways that couple instructions, data and other information between each flash memory device 9 and flash controller 3. In the embodiment shown in FIG. 2 each flash memory device 9 (e.g., a NAND device) includes registers 31, a microcontroller 32 and a memory array 33, and is coupled to flash controller 3 by a chip enable signal line (CE#), a command latch enable signal line (CLE), a read enable signal line (RE#), an address latch enable signal line (ALE), a write enable signal line (WE#), a read/busy signal line (RB) and input and output signal lines (DQ). Upon receiving a write instruction from a host computer, write circuit 8 is operable to encode received data into a codeword that is sent to registers 31 along with a corresponding program instruction. Microcontroller 32 is operable to perform the requested write instruction and retrieve the codeword from register 31 and store the codeword in memory array 33 by programming cells of memory array 33 (e.g., as a logical page).

In one example, each flash memory device 9 includes NAND memory cells that are organized into blocks and pages, with each block composed of NAND strings that share the same group of wordlines. Each logical page is composed of cells belonging to the same wordline. The number of logical pages within each logical block is typically a multiple of 16 (e.g. 64, 128). In the present embodiment, a logical page is the smallest addressable unit for reading from, and writing to, the NAND memory cells of each flash memory device 9 and a logical block is the smallest erasable unit. However, it is appreciated that in embodiments of the present invention, programming less than an entire logical page may be possible, depending on the structure of the NAND array. Though flash memory devices 9 are illustrated as being NAND devices, it is appreciated that flash memory devices 9 may be any type of memory storage device that uses a threshold voltage for reading memory cells of the flash memory device 9.

In response to receiving a read instruction from the host computer, read circuit 6 is configured to perform a read of a respective flash memory device 9 using a threshold-voltage-shift read operation. More particularly, read circuit 6 is operable to send a threshold-voltage-shift read instruction 34 to flash memory device 9. Microcontroller 32 reads the respective memory array 33 in response to the threshold-voltage-shift read instruction and outputs the read results at registers 31. The read results are sent to decoder 7 that is operable to decode the read results to obtain the stored codeword.

Flash memory devices 9 may be SLC, MLC, TLC or QLC NAND devices. In the present embodiment flash memory devices 9 are capable of performing a wide range of threshold-voltage-shift reads, including reads specified by whole number offset values such as $-n \ldots -2, -1, 0, +1, +2, \ldots n$ without limitation.

An erased block of a flash memory device 9 may be referred to as a "free block." When data is programmed into a block that has been erased the block is referred to as an "open block" until all pages of the block have been programmed. Once all pages of the block have been programmed the block is referred to as a "closed block" until it is again erased.

Figure 3:
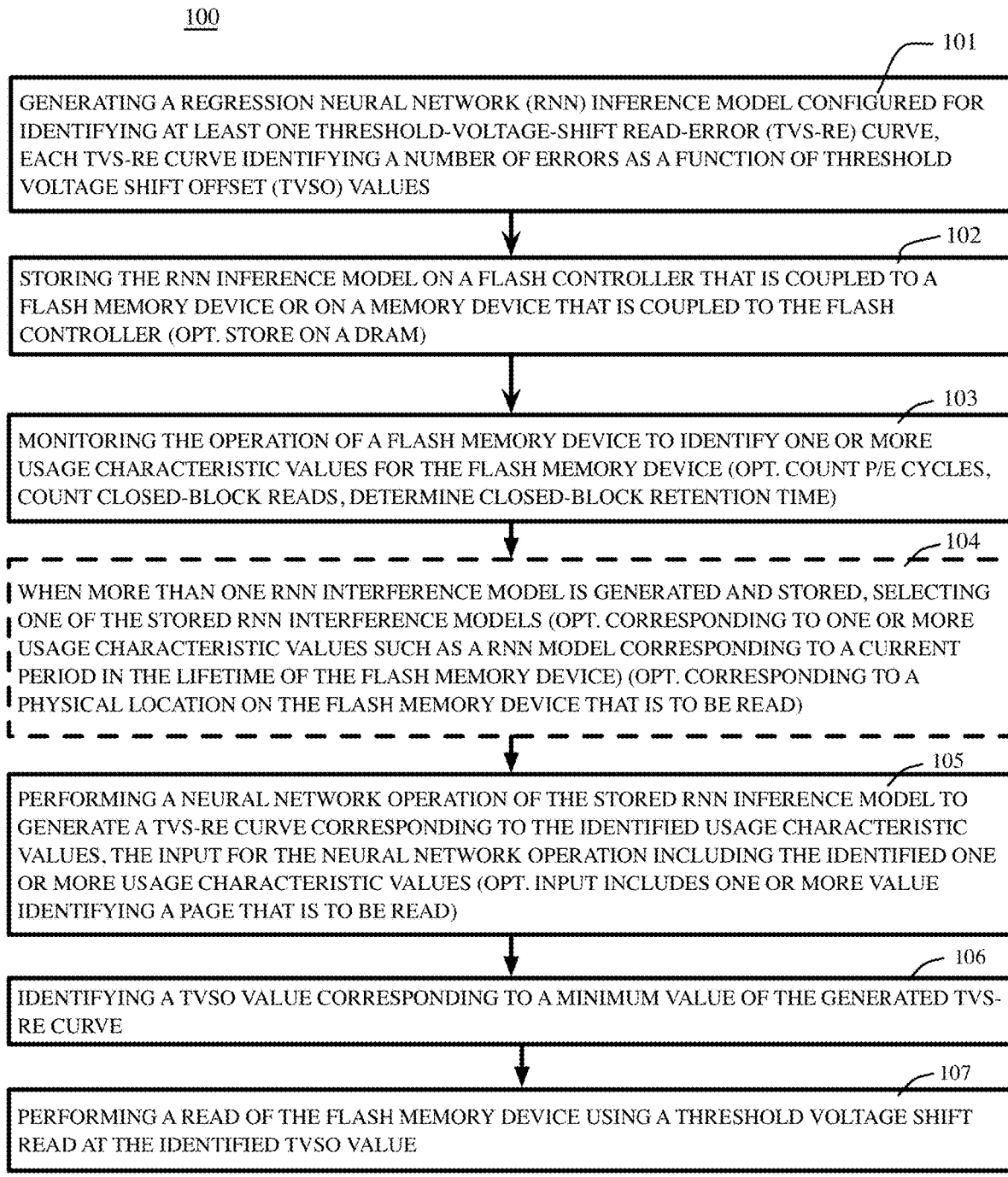
FIG. 3 is block diagram illustrating method for reading a flash memory device in accordance with an embodiment of the present invention.

A method 100 for reading a flash memory device is illustrated in FIG. 3. In the following discussion, method 100 is discussed with reference to the flash controller 3 of FIG. 1. Method 100 includes generating (101) an RNN inference model. The RNN inference model is configured to identify at least one TVS-RE curve, where each TVS-RE curve identifies a number of errors as a function of TVSO values. Generation of the RNN inference model (step 101) is preferably performed prior to sale and use of an SSD 10 and prior to delivery of a flash controller 3 to a customer for use in fabrication of an SSD 10. Depending on the computing power of the flash controller generation of the RNN inference model can be performed on SSD 10 or performed using a testing and model generation system such as testing and model generating system 70 shown in FIG. 7 as will be discussed in more detail below and stored in data storage 4 of the SSD 10. When the generation of the RNN inference model is performed using testing and model generating system 70, it is performed exclusively on testing and model generating system 70 and is not performed on SSD 10.

The RNN inference model is stored (102) on a flash controller that is coupled to the flash memory device or on a memory device that is directly coupled to the flash controller. In one example, one or more RNN inference model(s) 12 is stored in data storage 4 of a flash controller 3, preferably prior to delivery of the flash controller 3 to a customer. RNN inference model(s) 12 may also be stored in memory device 13. Each RNN inference model 12 is configured to identify at least one TVS-RE curve, where each TVS-RE curve identifies a number of errors as a function of TVSO values.

The operation of a flash memory device is monitored (103) to identify one or more usage characteristic values of the flash memory device. In one example, status circuit 5 is operable to monitor the operation of each flash memory device 9 to identify one or more usage characteristic values of flash memory devices 9. The determined usage characteristic values may be stored in registers of flash controller 3, in data storage 4 in flash memory devices 9 or in memory device 13. The term "usage characteristic value" as used in the present invention is a value determined during usage of a flash memory device that can affect threshold voltage distribution such as, for example, a value indicating the current age/physical degradation of the location that is to be read (e.g., the number of P/E cycles or Bit Error Rate (BER)) or indicating the current transitory characteristics of the location that is to be read (e.g., closed-block read disturb and closed-block retention time).

The usage characteristic values may include a read disturb value. In one example, each time that a block is closed, status circuit 5 is operable to count the number of reads of the block while the block is closed and the number of reads of the block while the block is closed is stored as a read disturb value. When a block is erased the read disturb value of the erased block is reset to zero.

The usage characteristic values may include a closed-block retention time. In one example, each time that a block is closed, status circuit 5 is operable to start a timer to determine the amount of time that has elapsed since the block was closed. The elapsed time as determined by the timer at any point in time is defined as a closed-block retention time value. When a block is erased the timer for that block is stopped and the closed-block retention time value of the erased block is reset to zero.

The usage characteristic values may include a number indicating the number of program and erase operations of each block. In one example, status circuit 5 is operable for counting the number of program and erase cycles of each block of the flash memory device during the entire lifetime of the flash memory device and storing the count in data storage 4 or DRAM 13.

The usage characteristic values may also include a BER of a block or a group of blocks. In one example status circuit 5 is operable to periodically determine a BER of each block and the BER for each block is stored as a BER value. In one example, each time that a BER value is calculated it is stored in data storage 4 or DRAM 13 so as to overwrite a previously stored BER value for the particular block.

Optionally, when more than one RNN inference model is generated and stored, method 100 includes selecting (104) the one of the stored RNN inference models. In one example the one of the stored RNN inference models that corresponds to a current period in the lifetime of the flash memory device is selected.

A neural network operation of the stored RNN inference model is performed (105) to generate a TVS-RE curve corresponding to the identified usage characteristic values. The input for the neural network operation includes the identified one or more usage characteristic values and one or more value identifying a page that is to be read (e.g. a value identifying the physical location of the page that is to be read such as, for example, a value identifying one or more of the wordline, the block, the plane or the flash device that is to be read). In one example neural processing module 11 is configured to perform a neural network operation of the stored RNN inference model 12 to generate a TVS-RE curve corresponding to the identified usage characteristic values, where the input for the neural network operation includes the identified one or more usage characteristic values and one or more value identifying a page that is to be read. In one example, neural processing module 11 comprises a specialized hardware module (e.g., a specialized configurable accelerator) specifically configured to perform the neural network operation, and the specialized hardware module may also be referred to hereinafter as a "neural network engine." In one embodiment step 105 is performed in response to receiving a read command from a host computer (e.g., each time that a read command is received), with the value identifying the page that is to be read being a value indicting the physical location in flash memory device 9 corresponding to the read address included with the read instruction. Step 105 may also be performed upon an internal controller event such as an event by a timer or a counter, or by the flash controller 3 (e.g., a background read) to monitor the reliability state of the flash memory devices 9.

A TVSO value is identified (106) corresponding to a minimum value of the generated TVS-RE curve. In one example, minimum function module 2 is configured to determine a minimum value for the generated TVS-RE curve and to identify a TVSO value corresponding to the determined minimum value. Minimum function module 2 may include software, hardware and/or firmware for receiving the coefficients of the generated TVS-RE curve, identifying a minimum point of the curve and outputting the TVSO value corresponding to the identified minimum point of the curve.

A read of the flash memory device is then performed (107) using a threshold-voltage-shift read at the TVSO value identified in step 106. The neural network operation of step 105 is performed each time that a read instruction is received from a host computer. More particularly, in response to receiving a read instruction at host connector receptacle 14, steps 103, optionally step 104, and steps 105-106 are performed so as to identify a TVSO value and read circuit 6 uses the TVSO value identified in step 106 to perform the read.

In another example, steps 105-106 are performed periodically and the results (the TVSO values) are stored in a table (e.g., an optional table 15a that includes usage characteristics and corresponding TVSO values, that may be referred to as a "TVSO table"). In this example, when the read of step 107 is to be performed the usage characteristics identified in step 103 are used to look up the corresponding TVSO value to use in the read of step 107.

Example 1, Single RNN Inference Model Stored

In one example a single RNN inference model is stored in step 102 that predicts a TVS-RE curve for different points in the lifetime of the flash memory device, step 103 includes monitoring the operation of the flash memory device to determine a current point in the lifetime of the flash memory device, and the input for the neural network operation includes a value identifying the determined current point in the lifetime of the flash memory device. In one example the value identifying the current point in the lifetime of the flash memory device is a number of program and erase cycles. Alternatively, the value identifying the current point in the lifetime of the flash memory device is a the BER of the block of the page that is to be read.

Figure 4A:
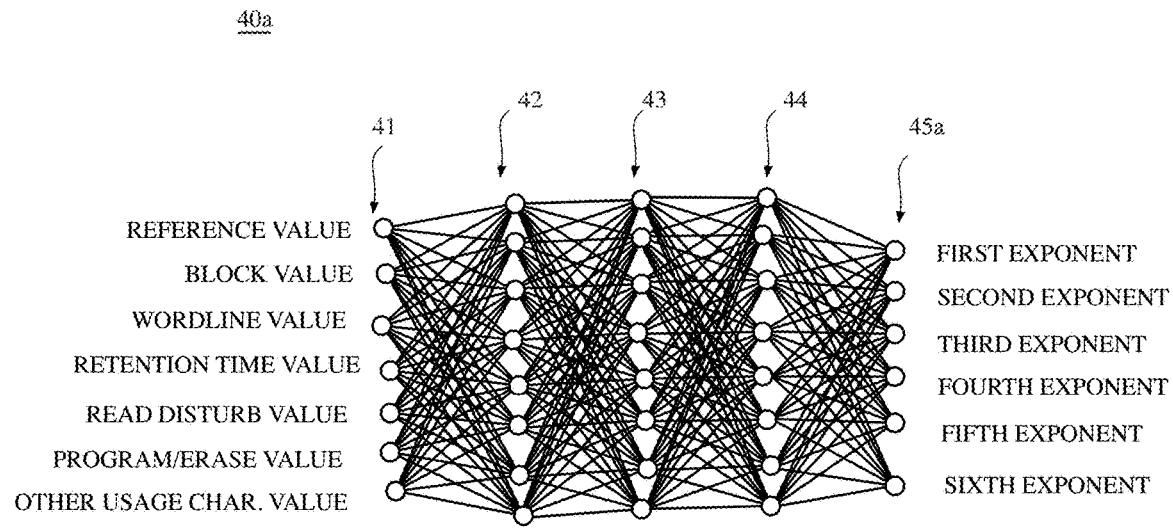
FIG. 4A is a diagram illustrating an RNN inference model that includes a number of program and erase cycles as input and that may be used over the entire lifetime of a flash memory device in accordance with an embodiment of the present invention.

FIG. 4A shows a diagram of an exemplary RNN inference model 40a that includes a plurality of input neurons 41, a plurality of output neurons 45a and layers 42-44 of hidden neurons. The input for the RNN inference model includes a reference value (REFERENCE VALUE) that identifies one or more characteristic of the flash memory device that is to be read, such as for example, a manufacturer, a part number, and/or a manufacturing lot number, without limitation. By including a reference value identifying the type of flash memory device, an RNN inference model can be used that can identify a TVS-RE curve for different types of flash memory devices.

The inputs include one or more value identifying a page that is to be read, which in this example includes a BLOCK VALUE identifying the block of the page that is to be read in step 107 and a WORDLINE VALUE indicating a wordline of the page that is to be read. In one exemplary embodiment in which SSD 10 includes 128 flash memory devices 9, each of which includes 2048 blocks, blocks may be assigned block numbers 0 through 262,143 with the BLOCK VALUE being the block number of the page that is to be read in step 107.

In this example, step 103 includes counting a number of closed-block reads, and the input for the neural network operation includes a value indicating the number of closed-block reads of the block containing the page that is to be read (i.e. READ DISTURB VALUE). Step 103 also includes determining a closed-block retention time, the input for the neural network operation including a value indicating the closed-block retention time of the block containing the page that is to be read (i.e. RETENTION TIME VALUE). In addition, step 103 includes counting a number of program and erase cycles of each block of the flash memory device, and the current point in the lifetime of the flash memory device is determined to be a current number of program and erase cycles of the block containing the page that is to be read (i.e. PROGRAM/ERASE VALUE).

In this example, step 103 identifies the following usage characteristic values: RETENTION TIME VALUE, READ DISTURB VALUE, PROGRAM/ERASE VALUE and an exemplary OTHER USAGE CHARACTERISTIC VALUE that can be any measured value that can affect threshold voltage distribution, such as, for example a temperature value, without limitation. The input for the neural network operation includes the usage characteristic values RETENTION TIME VALUE, READ DISTURB VALUE, PROGRAM/ERASE VALUE and OTHER USAGE CHARACTERISTIC VALUE.

Output neurons 45a generate output in the form of exponent values that define a TVS-RE curve. The exemplary output of RNN inference model 40a is shown to include six exponents, shown as FIRST EXPONENT, SECOND EXPONENT, THIRD EXPONENT, FOURTH EXPONENT, FIFTH EXPONENT and SIXTH EXPONENT. It is appreciated that the RNN inference model 40a may have any number of exponents, and that the number of exponents may be altered to achieve a balance between processing time and accuracy.

Figure 4B:
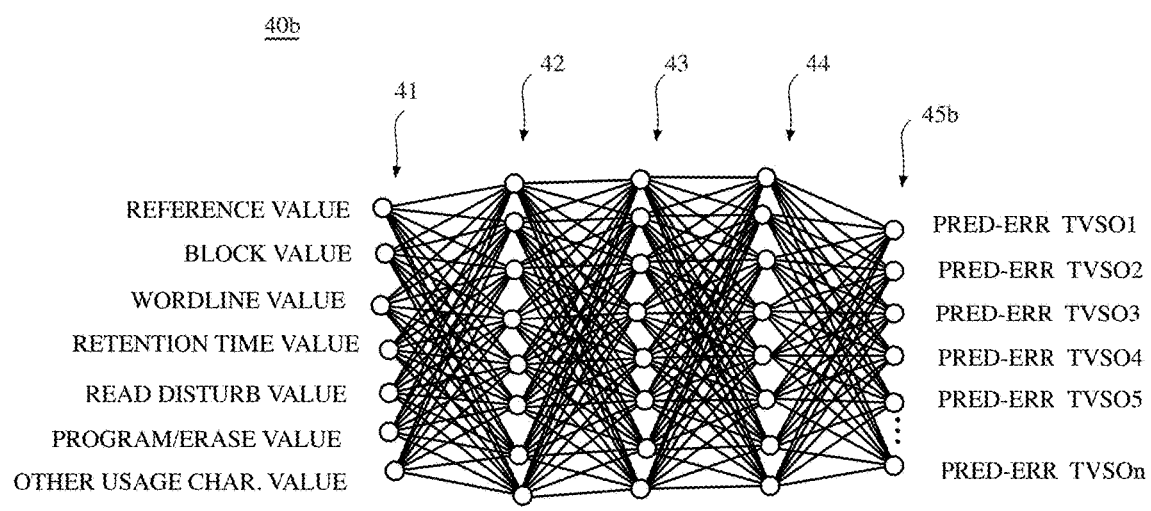
FIG. 4B is a diagram illustrating an RNN inference model in which the output neurons include an output neuron for each TVSO value in accordance with an embodiment of the present invention.

In the example shown in FIG. 4B, output neurons 45b generate values that indicate the number of errors at locations corresponding to TVSO values. In this example, output neurons 45b include an output neuron for each TVSO value (for n TVSO values), such as, for example an output neuron that predicts the error when a first TVSO value is used (PRED-ERR TVSO1), an output neuron that predicts the error when a second TVSO value is used (PRED-ERR TVSO2), an output neuron that predicts the error when a third TVSO value is used (PRED-ERR TVSO3), an output neuron that predicts the error when a fourth TVSO value is used (PRED-ERR TVSO4), an output neuron that predicts the error when a fifth TVSO value is used (PRED-ERR TVSO5) and so on, to an output neuron that predicts the error when an $n^{th}$ TVSO value is used (PRED-ERR TVSOn). In one specific example, TVSO values from −32 . . . 0 . . . +32 are used and PRED-ERR TVSO1 is the predicted error when a TVSO of −32 is used, PRED-ERR TVSO2 is the predicted error when a TVSO of −31 is used, PRED-ERR TVSO3 is the predicted error when a TVSO of −30 is used, PRED-ERR TVSO4 is the predicted error when a TVSO of −29 is used, PRED-ERR TVSO5 is the predicted error when a TVSO of −28 is used, and PRED-ERR TVSOn is the predicted error when a TVSO of +32 is used.

When the output is values that indicate the magnitude of the number of errors at locations corresponding to TVSO values as is shown in FIG. 4B, in step 106 minimum finder program 83 need only identify which output generates the lowest error to determine the TVSO value corresponding to the minimum value of the TVSE curve since it is known which TVSO value corresponds to each output neuron. However, when the output neurons generate output in the form of exponents, minimum finder program 83 includes an algorithm for identifying where the minimum value is (e.g., where on the x-axis) and that identifies the TVSO value that corresponds to the identified minimum point on the curve (e.g., the closest whole number TVSO value to the identified minimum point on the curve).

Example 2, Multiple RNN Inference Models Stored Corresponding to Periods

In this example step 102 further includes storing a plurality of RNN inference models 12, each of the plurality of RNN inference models 12 identifying TVS-RE curves for a different period in the lifetime of the flash memory device 9.

Figure 5:
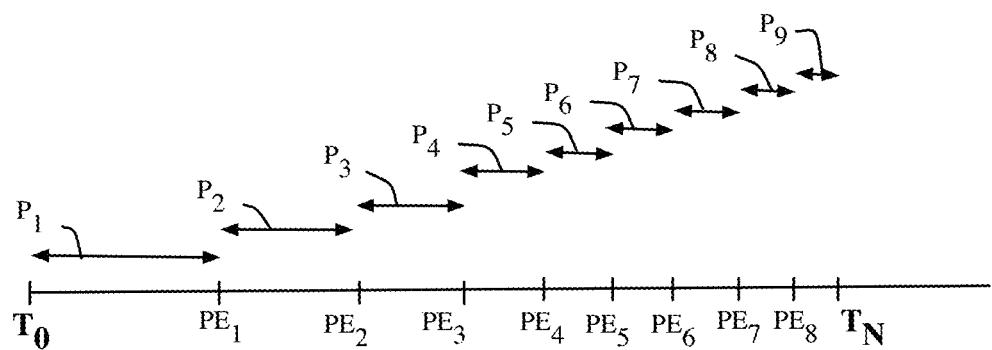
FIG. 5 is a diagram illustrating time periods in the lifetime of an exemplary flash memory device in accordance with an embodiment of the present invention.

FIG. 5 shows exemplary periods $P_1$ through $P_9$ during a lifetime of an exemplary flash memory device 9, beginning at the initial time $T_0$ of the flash memory device 9 and ending at the end of life $T_N$ of the flash memory device 9. In this example, each period $P_1$ through $P_9$ is represented by a number of program and erase cycles ($PE_1$ through $PE_8$). For example, exemplary period $P_2$ begins at a number of program and erase cycles shown as $PE_1$ and ends at a number of program and erase cycles $PE_2$. As the flash memory device 9 ages, shorter periods may be desirable to make sure that the number of read errors are minimized. Though a threshold-voltage-shift read operation is disclosed to be used during the entire lifetime of the flash memory device 9, it is appreciated that, alternatively, a conventional read instruction such as a READ PAGE instruction may be used early in the lifetime of the flash memory device 9, since reads at the default threshold voltage are not likely to result in read errors early in the life of the flash memory device 9.

In one example a plurality of RNN inference models are stored in step 102 each corresponding to a respective one of the exemplary periods $P_1$ through $P_9$ shown in FIG. 5. Accordingly, a first RNN inference model will be stored corresponding to $P_1$, a second RNN model will be stored that corresponds to $P_2$, and so on.

In this example, step 103 includes monitoring the operation of the flash memory device 9 to determine a current period in the lifetime of the flash memory device 9 and the one of the plurality of RNN inference models 12 corresponding to a current period in the lifetime of the flash memory device is selected in step 104. In this example, step 103 may include counting a number of program and erase cycles of each block of the flash memory device 9, and the current period in the lifetime of the flash memory device 9 is determined to be a period (e.g., one of periods $P_1$ through $P_9$) corresponding to the current number of program and erase cycles of the block containing the page that is to be read. In one example, status circuit 5 is operable to determine a current number of program and erase cycles of the block containing the page that is to be read and to identify a current period in the lifetime of the flash memory device that is being read using the identified current number of program and erase cycles (e.g., by storing a table indicating a period and a corresponding number of program and erase cycles and performing a lookup operation on the table with the current number of program and erase cycles for the block containing the page that is to be read).

Figure 6:
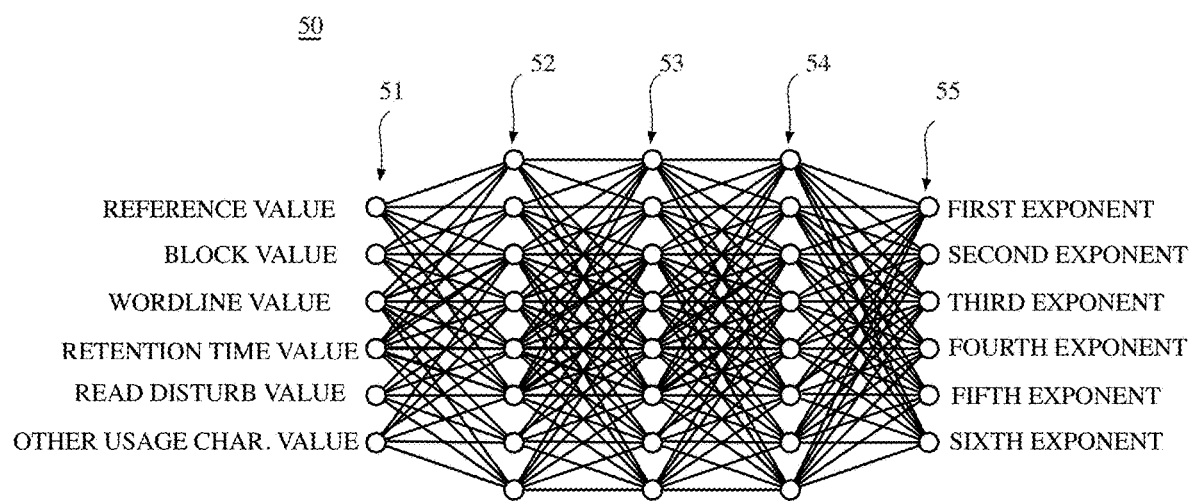
FIG. 6 is a diagram illustrating an RNN inference model for a particular time period in the life of a flash memory device in accordance with an embodiment of the present invention.

In one example, neural processing module 11 is operable upon receiving input from status circuit 5 identifying the current period to select the corresponding RNN inference model 12 and to perform (105) a neural network operation of the selected RNN inference model to generate a TVS-RE curve. FIG. 6 shows a diagram of an exemplary RNN inference model 50 that can be used in accordance with the present example. RNN inference model 50 includes a plurality of input neurons 51, a plurality of output neurons 55 and layers 52-54 of hidden neurons. It can be seen that RNN inference model 50 does not include a neuron for receiving a number of program and erase cycles (PROGRAM/ERASE VALUE) as did RNN inference models 40a-40b. In this example, the number of program and erase cycles is not required as input since the error characteristics relating to usage/age of the flash memory device is a characteristic of the RNN inference model 50 that is selected. Though RNN inference model 50 shows output neurons 55 that generate coefficients of a TVSO curve, output neurons 55 could also indicate the amount of error at different TVSO values as shown in FIG. 4B.

Example 3, Generating a Neural Network Model (step 101)

Figure 7:
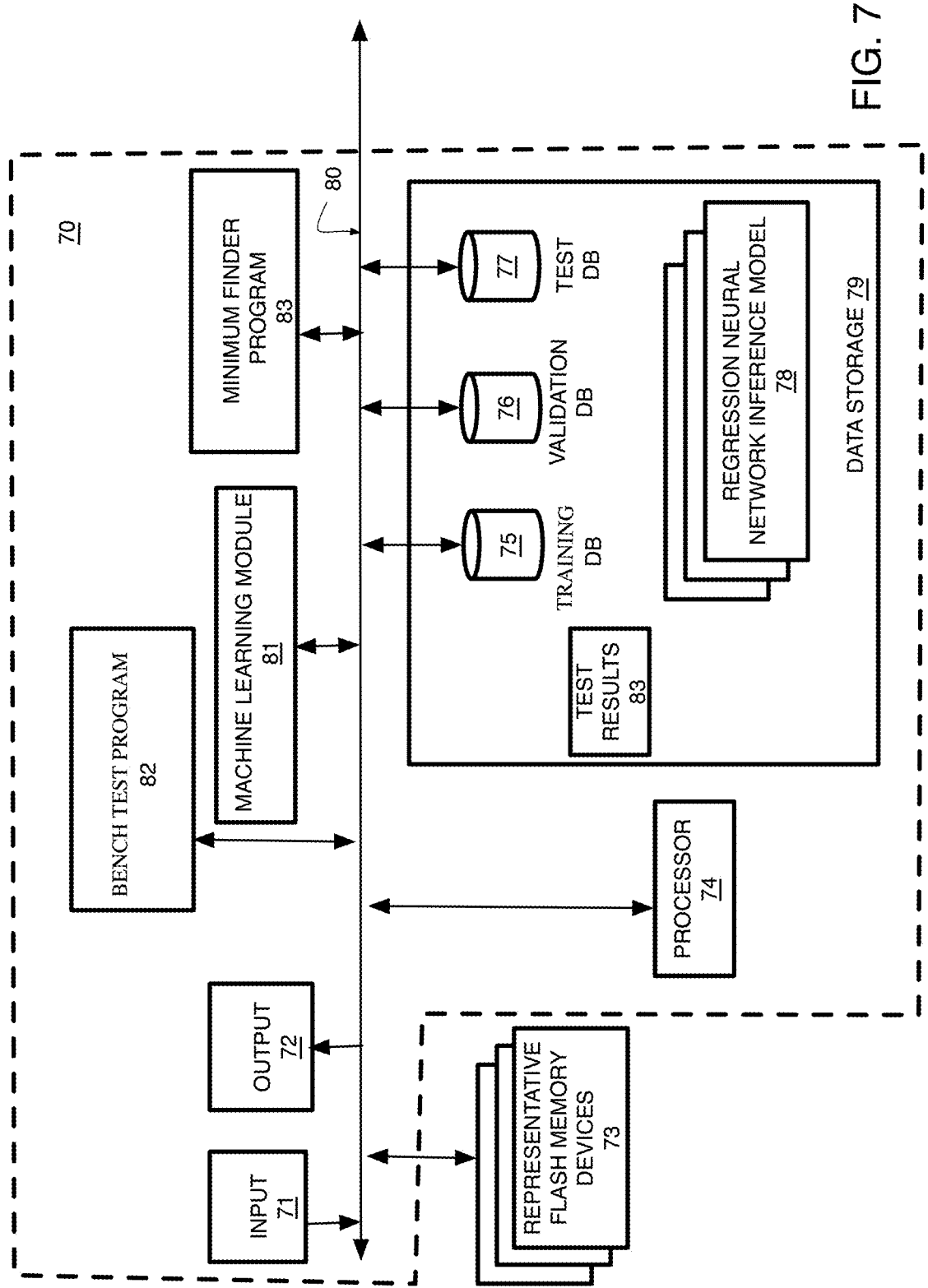
FIG. 7 is a diagram illustrating a testing and model generation system in accordance with an embodiment of the present invention.

FIG. 7 illustrates an exemplary test and model generation system 70 that may be used for generating an RNN inference model in accordance with an embodiment of the invention. The system includes an input 71, an output 72, a processor 74, a data storage 79 and a minimum finder program 83 that are coupled together via a network 80. Minimum finder program 83 is a software program operable on processor 74, and may thus represent electronically readable instructions, that may be the same as the program used by minimum function module 2 shown in FIG. 1, that is operable to identify a minimum value of a function. Test and model generation system 70 includes a bench test program 82, which may represent electronically readable instructions, that is operable on processor 74 for testing representative flash memory devices 73 in such a way as to identify the number of errors that occur as the representative flash memory devices 73 age. Representative flash memory devices 73 may be inserted into one or more test fixture that couples to test and model generation system 70. Representative flash memory devices 73 are devices that are similar to, or identical to, flash memory devices 9, and may be the same type of device (e.g. the same type of NAND device), made by the same manufacturer as flash memory devices 9. Machine learning module 81 may represent electronically readable instructions, that is operable on processor 74 for generating a neural network such as, for example, neural networks 40a, 40b or 50 shown in FIGS. 4A, 4B and 6, and may include a computer program operable on processor 74.

Figure 8:
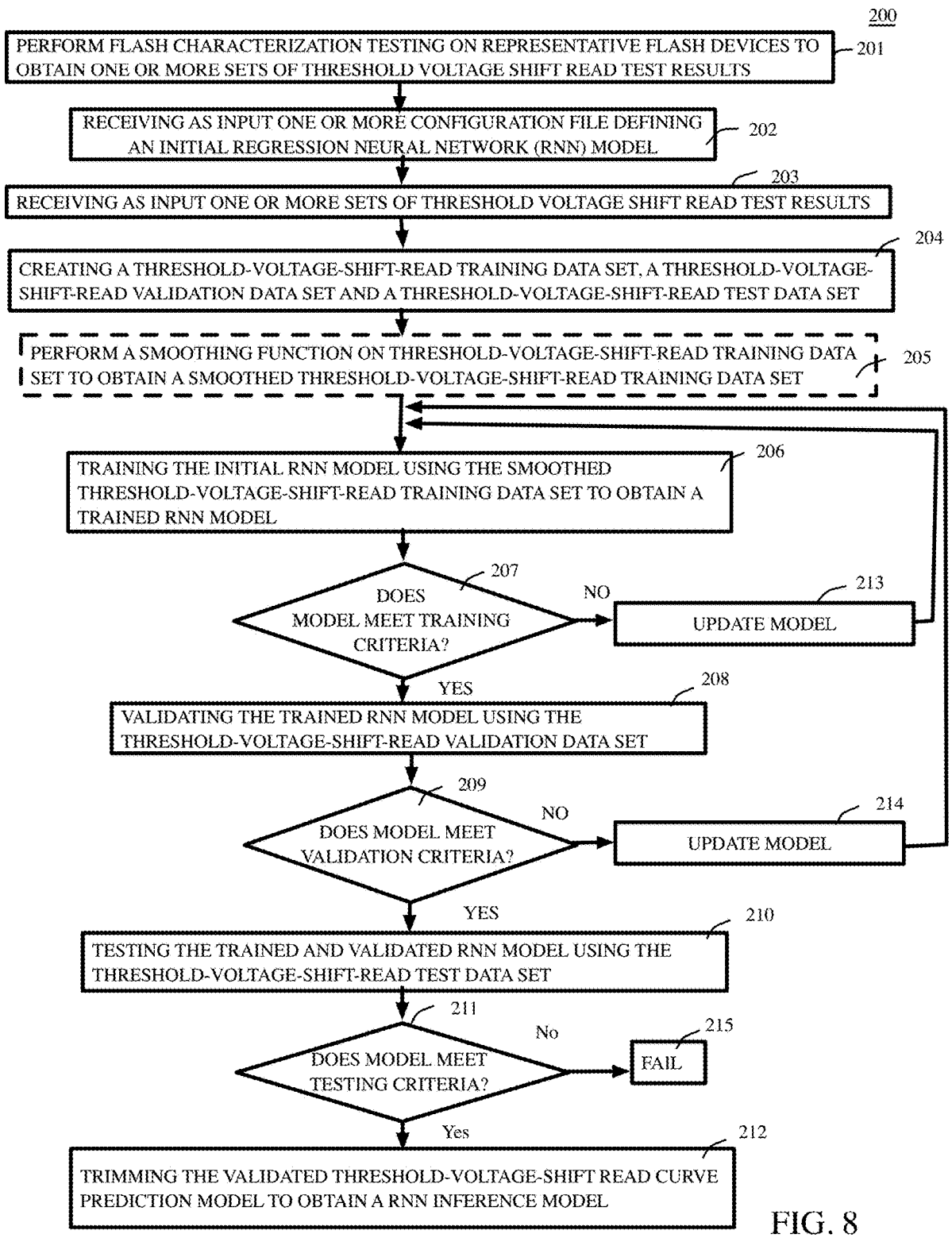
FIG. 8 is block diagram illustrating a method for generating a neural network model in accordance with an embodiment of the present invention.

In one embodiment that is illustrated in FIG. 8 a method 200 for generating an RNN inference model is disclosed that includes performing flash characterization testing (201) on representative flash memory devices 73 to obtain one or more sets of threshold-voltage-shift read test results. In one example that is illustrated in FIG. 7, numerous representative flash memory devices 73 are tested under varying conditions to obtain one or more sets of threshold-voltage-shift read test results 83 that may be stored in data storage 79. The set(s) of test results represent different characterized points or periods in the lifetime of a characterized flash memory device and different operating conditions of the characterized flash memory device as a result of different testing conditions applied during the testing of flash memory devices 73.

In one example step 201 includes performing a test on a representative flash memory device 73 that identifies number of errors and testing feature values for each of a plurality of identified features of the respective representative flash memory device 73 that is being tested such as, for example a REFERENCE VALUE of the respective representative flash memory device 73 that is being tested, a BLOCK VALUE identifying the block of the page that was read in the test, a WORDLINE VALUE indicating a wordline of the page that was read in the test, a READ DISTURB VALUE indicating the number of closed-block reads of the block containing the page that was read in the test, a RETENTION TIME VALUE indicating the closed-block retention time of the block containing the page that was read in the test and a PROGRAM/ERASE VALUE of the block containing the page that was read in the test.

Figure 9:
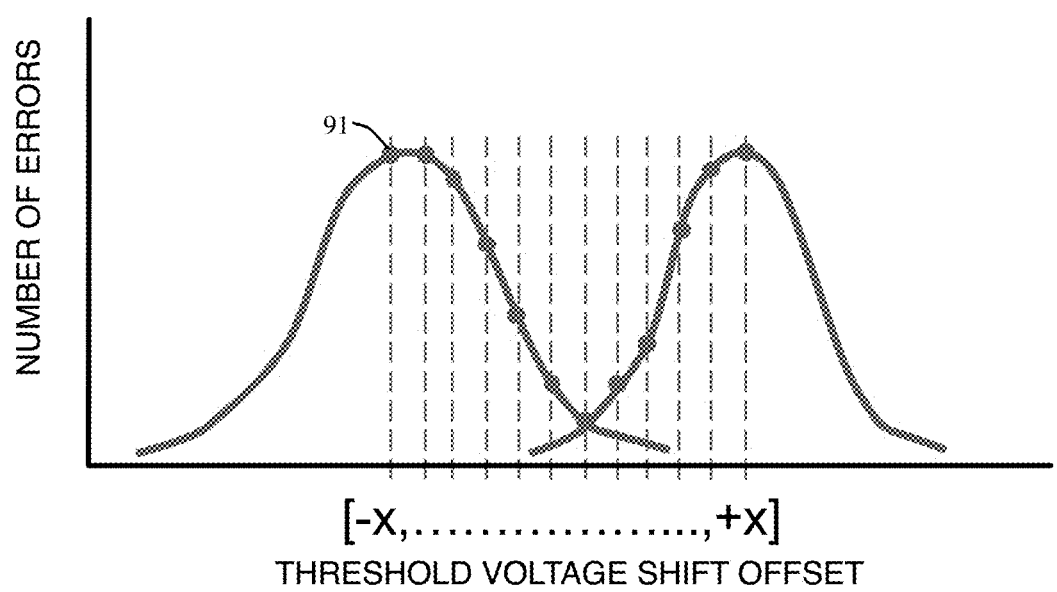
FIG. 9 is a graph illustrating a number of errors on the horizontal axis and threshold voltage shift offset on the horizontal axis that illustrates errors in reading an exemplary flash memory device in accordance with an embodiment of the present invention.

FIG. 9 illustrates a graph representing exemplary flash characterization testing for an exemplary memory cell that illustrates different TVSO values on the x-axis and the number of errors on the y axis. The result of this process, i.e. the collection of the number of errors at different VT-shift values (dots 91), is a curve, where a portion of the curve is shaped like a "valley." The RNN inference model 78 of the present invention generates a curve that includes this valley for each of the conditions simulated during the testing of step 201.

One or more configuration file defining an initial RNN inference model is received as input (202). In one example, the one or more configuration file is received through input 71 and temporarily stored in data storage 79. When operation of machine learning module 81 is initiated, the configuration file received in step 202 defines the architecture of the initial RNN inference model (e.g., the number of input neurons, hidden neurons and output neurons and the connections between the neurons) and input needed to control and define the operation of machine learning module 81 during the process of steps 202-215. In one example, the configuration file(s) received in step 202 define features of the initial RNN inference model (e.g., reference number, block, wordline, number of closed-block reads, closed-block retention time and program/erase value) and include an initial set of parameters and hyperparameters. In one example the initial set of parameters includes initial weights and bias values for each neuron in the initial RNN model (e.g., the initial weights and bias values may all be set to zero or to a random number).

One or more sets of threshold-voltage-shift read test results are received as input (203). In one example one or more of the sets of threshold-voltage-shift read test results 83 created in step 201 are input into machine learning module 81.

Method 200 further includes creating (204) a threshold-voltage-shift-read training data set, a threshold-voltage-shift-read validation data set and a threshold-voltage-shift-read test data set. In one example, machine learning module 81 is operable to separate (e.g., by a random process) the threshold-voltage-shift read test results 83 into a training database 75 that includes a threshold-voltage-shift-read training data set, a validation database 76 that includes a threshold-voltage-shift-read validation data set and a test database 77 that includes a threshold-voltage-shift-read test data set.

Figure 10:
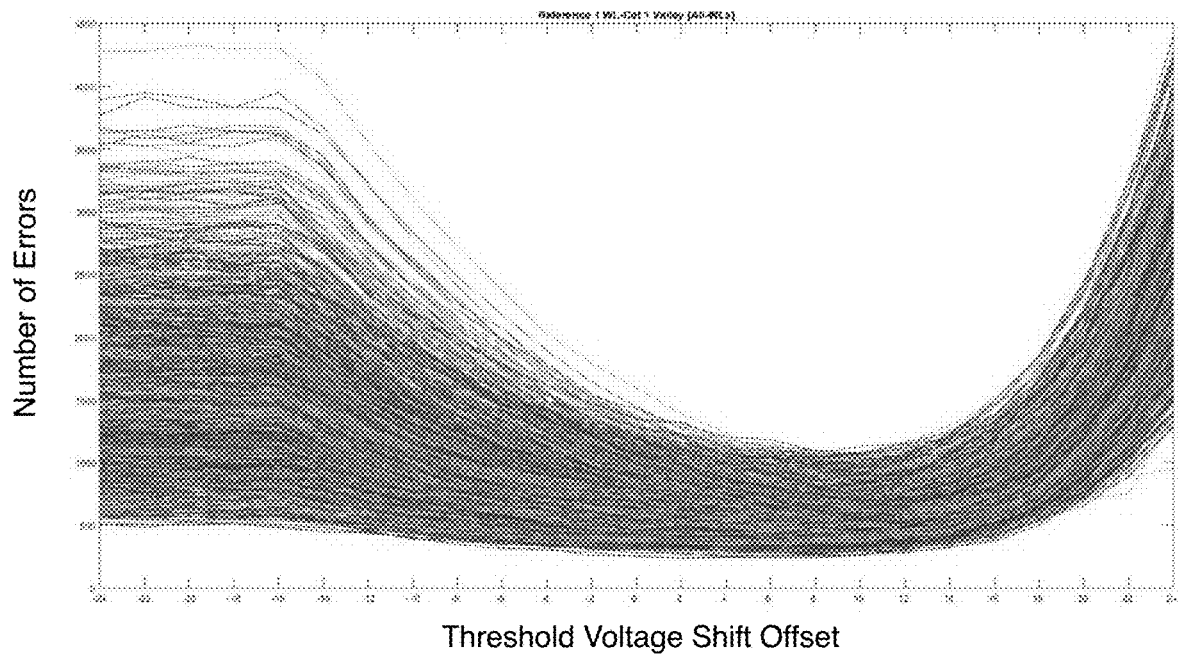
FIG. 10 is a graph illustrating exemplary threshold-voltage-shift read-error curves generated from an exemplary threshold-voltage shift-read training data set in accordance with an embodiment of the present invention.
Figure 11:
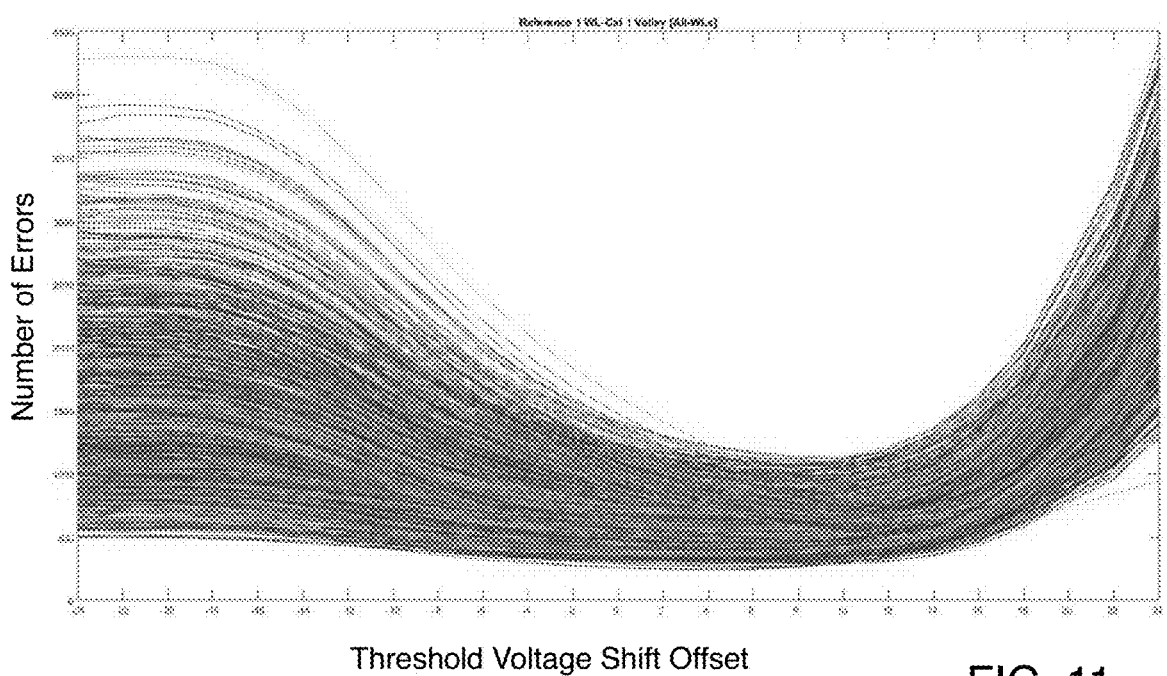
FIG. 11 is a graph illustrating exemplary smoothed threshold-voltage-shift read-error curves generated from an exemplary smoothed threshold-voltage shift-read training data set in accordance with an embodiment of the present invention.

The initial RNN inference model is trained (206) using the threshold-voltage-shift read training data set to obtain a trained RNN model. In one example machine learning module 81 is operable to perform training of the initial RNN inference model to generate RNN inference model 78 that may be stored in data storage 79. In one example the, the number of errors at each tested TVSO value is loaded into the input neurons, feature values from the test are input into corresponding neurons and a backpropagation algorithm is performed to identify a new set of parameters for the RNN model. This process is repeated until all of the records in the threshold-voltage-shift read training data set have been processed. The trained RNN inference model incorporates the wordline-to-wordline and block-to-block variability of the tested representative flash memory devices 73 to identify TVS-RE curves that reflect the wordline-to-wordline and block-to-block variability as well as variability corresponding to usage characteristics. FIG. 10 shows an example of TVS-RE curves generated from an exemplary threshold-voltage shift-read training data set. More particularly, the number of errors is shown on the y-axis and TVSO is shown on the x-axis. As can be seen in FIG. 10, because of the nature of the NAND flash read circuitry there are fluctuations (noise) in the number of errors of each valley. This noise negatively impacts the learning process of the RNN inference model which may impact the actual position of the minimum of the valley and lead to calculation of incorrect TVSO values. To avoid this problem a smoothing algorithm such as a moving average or multi-polynomial interpolation is optionally applied to the training data set as is shown by step 205 prior to training the RNN in step 206 to generate a smoothed threshold-voltage-shift-read training data set (where the shape of the valleys represented by the target data set are smoothed). FIG. 11 shows an example of TVS-RE curves generated from an exemplary smoothed threshold-voltage shift-read training data set. Accordingly, because the smoothing function (205) is performed prior to training (206), the RNN inference model is not trained to predict the TVS-RE curve corresponding to the exact number of errors measured during the device's characterization step (performed in step 201 and input in step 203), but rather is trained to predict the TVS-RE curve corresponding to the smoothed threshold-voltage-shift-read training data set.

The trained RNN inference model is compared to predetermined training criteria (207). If the trained RNN inference model does not meet predetermined training criterial the initial RNN inference model is updated (213) and the training process is repeated to generate a new trained RNN inference model (206). Step 213 may include adding additional parameters, hyperparameters and/or neurons. Also, step 213 could also include adding additional threshold voltage shift read test data to the threshold-voltage-shift-read training data set.

If the trained RNN inference model meets predetermined training criterial the RNN inference model is validated (208) using the threshold-voltage-shift-read validation data set. In one example machine learning module 81 is operable to perform validation using the threshold-voltage-shift read validation data set to generate a trained and validated RNN inference model that may be temporarily stored in data storage 79. The trained and validated RNN inference model is compared to predetermined validation criteria (209). If the trained and validated RNN inference model does not meet predetermined validation criterial the initial RNN model is updated (214) and the process of training (206), testing (207) and validation (208) is repeated. Step 214 may include adding additional parameters, hyperparameters and/or neurons. Also, step 214 could also include adding additional threshold voltage shift read test data to the threshold-voltage-shift-read training data set.

If the trained and validated RNN inference model meets predetermined validation criterial the RNN inference model is tested (210) using the threshold-voltage-shift read test data set. The trained, validated and tested RNN inference model is compared to predetermined testing criteria (211). If the testing fails (215) the process is ended and must be restarted with a new initial RNN model.

If the trained, validated and tested RNN inference model meets the testing criteria of step 211 the trained, validated and tested RNN model is then trimmed (212), by removing unnecessary elements to obtain the RNN inference model 78 that may be stored in data storage 79. In one example step 212 includes removing those portions of the configuration file relating to the training/testing and validation phases of method 200 and converting the remaining elements of the RNN model into a different data format to speed up the inference time of the resulting final RNN inference model. In the present example step 212 includes converting the remaining elements of the RNN model from floating point to fixed point, e.g. 40 bits fixed point. In one example, step 212 produces TVS-RE inference model 12 shown in FIG. 1. The conversion from floating point to fixed point enables a neural processing module 11 with a lower gate count and reduces latency.

The criteria used in steps 207, 209, and 211 may be a cost function that determines "the goodness" of the training process. In one example, a Min-Squared-Error (MSE) function is used, with the objective of having an overall MSE that is as low as possible. MSE is thus computed at 207 to identify MSE achieved by training using the threshold-voltage-shift-read training data set. To pass to step 208 the MSE computed using the threshold-voltage-shift-read training data set must be below a predetermined threshold. MSE is computed at 209 to identify MSE achieved using the threshold-voltage-shift-read validation data set. To pass to step 210 the MSE computed using the threshold-voltage-shift-read validation data set must be below a predetermined threshold and must be close to the MSE computed using the threshold-voltage-shift-read training data set (e.g., within a predetermined tolerance). MSE is thus computed at step 211 to identify MSE achieved using the threshold-voltage-shift-read test data set. To pass to step 212 the MSE computed using the threshold-voltage-shift-read test data set must be below a predetermined threshold and must be close to both the MSE computed using the threshold-voltage-shift-read training data set and the MSE computed using the threshold-voltage-shift-read validation data set (e.g., within a predetermined tolerance).

In one example, optimal threshold voltage shift values, that may be referred to as "golden VT-opt" values are calculated after the characterization of step 201 (and separately from any of steps 202-209). The golden VT-opt values are optimal threshold voltage shift values calculated without using the RNN inference model generated by method 200. In one embodiment the golden VT-opt values are calculated by generating error curves using the test bench program 82 and using minimum finder program 83 to identify golden VT-opt values for the various testing samples.

In this example, step 211 includes operating the trained and validated RNN inference model (e.g., on processor 74) to identify coefficients of exemplary TVS-RE curves, and entering the identified coefficients into the minimum finder program 83 to identify predicted minimum TVSO values (e.g., by running the RNN inference model over the entire training data set and running minimum finder program 83 on the results to compute predicted minimum TVSO values). The predicted minimum TVSO values are then compared to the corresponding golden VT-opt values, and the method passes to step 212 when the predicted TVSO values calculated using the RNN inference model are within a range of the corresponding golden VT-opt values (e.g., within a predetermined tolerance).

When a single RNN inference model is to be generated that is to be used for the lifetime of the flash memory device (e.g., a RNN inference model used in example 1 above), the RNN inference model uses the value indicating the present point in the lifetime of the flash memory device (e.g., number of PE cycles) to generate output that is representative of the usage and age of the flash memory device. The generation of a single RNN inference model for use over the lifetime of the flash memory is advantageous since there is no need to store and manipulate multiple RNN inference models. However, training and validation is more extensive and time consuming because test data representing the full lifetime of the flash memory device must be used.

When multiple RNN inference models are generated to represent a particular flash memory device, more factors that affect threshold voltage can be accurately modeled, resulting in increased accuracy. However, the time required to load each of the different models into neural processing module 11 may result in system latency.

Grouping Examples

Multiple RNN inference models may be created in step 101 and stored in step 102 of FIG. 1, with each of the plurality of RNN inference models identifying threshold-voltage-shift read-error curves corresponding to one or more grouping of factors that affect threshold voltage. The one or more grouping of factors that affect threshold voltage may be a group of wordlines of the flash memory device, a group of blocks of the flash memory device, periods of time, a group of read disturbs and a group of retention times, without limitation.

In the following examples, characterization is performed for a single type of flash memory device so that each of the RNN interference models are directed to the single type of flash memory device. Accordingly, REFERENCE VALUE is not required as input since the RNN interference model will be trained using only test data relating to the single type of flash memory device that is coupled to flash controller 3. The following groupings are exemplary, and it is appreciated that many other combinations of groupings may also be used in accordance with embodiments of the present invention. In the following examples, retention time, read disturb and number of program and erase cycles are determined for each block to identify the one or more usage characteristic values. However, it is appreciated that retention time, read disturb and number of program and erase cycles can also be determined on a wordline basis.

A. Period Grouping

Figure 12A:
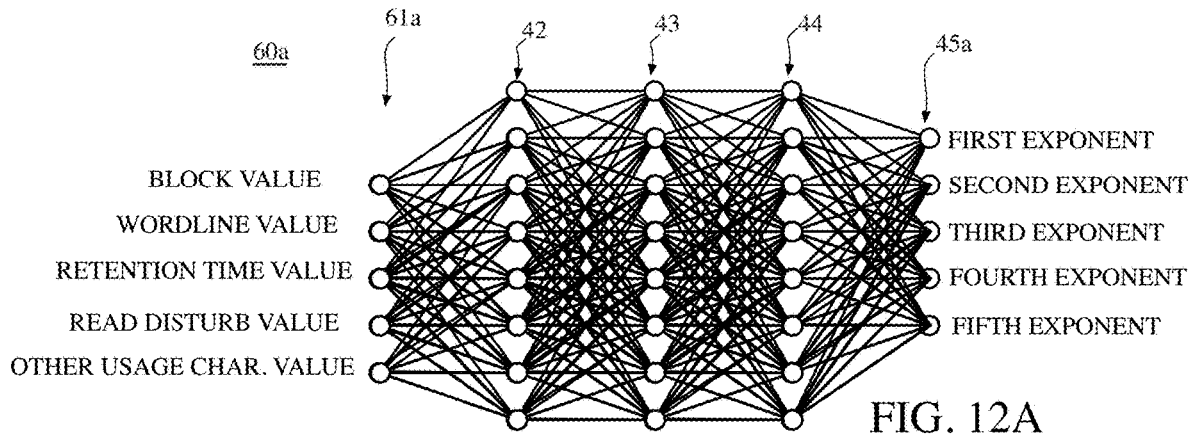
FIGS. 12A-12J are block diagram illustrating exemplary RNN inference models in accordance with an embodiment of the present invention.

In one example the lifetime of the flash memory device is grouped into periods based on the number of program and erase cycles and an RNN inference model is generated for each of a plurality of periods in the lifetime of the flash memory device (that may be referred to as "P/E-categorized RNN inference models"). In this example, each of the P/E-categorized RNN inference models are stored in step 102 on flash controller 3 and a P/E-categorized RNN inference model is selected in step 104 corresponding to the current time period. For example, a grouping table 15 can be stored in data storage 4 that includes program/erase values and corresponding values, or pointers, identifying the particular P/E-categorized RNN inference model to be used. In step 104 a lookup operation is performed on grouping table 15 using the current number of program and erase cycles of the wordline or block that is to be read in step 107 (or based on a total number of current program and erase cycles for the flash memory device) to identify the P/E-categorized RNN inference model to use. A P/E-categorized RNN inference model 60a is shown in FIG. 12A. Since P/E-categorized RNN inference model 60a correspond to a particular time period, it does not have program/erase values as input to input neurons 61a.

In one example, the periods in the life of the flash memory device are divided into seven different periods, a first period for the first 1,000 P/E cycles, a second period that is 1,001 P/E cycles to 2,000 P/E cycles, a third period that is 2,001 P/E cycles to 3,000 P/E cycles, a fourth period that is 3,001 P/E cycles to 4,000 P/E cycles, a fifth period that is 4,001 P/E cycles to 5,000 P/E cycles, a sixth period that is 5,001 P/E cycles to 6,000 P/E cycles, a seventh period that is 6,001 P/E cycles to 7,000 P/E cycles (which is the end of life) such that 7 P/E-categorized RNN inference models are stored in step 102.

B. Wordline Grouping

Figure 12B:
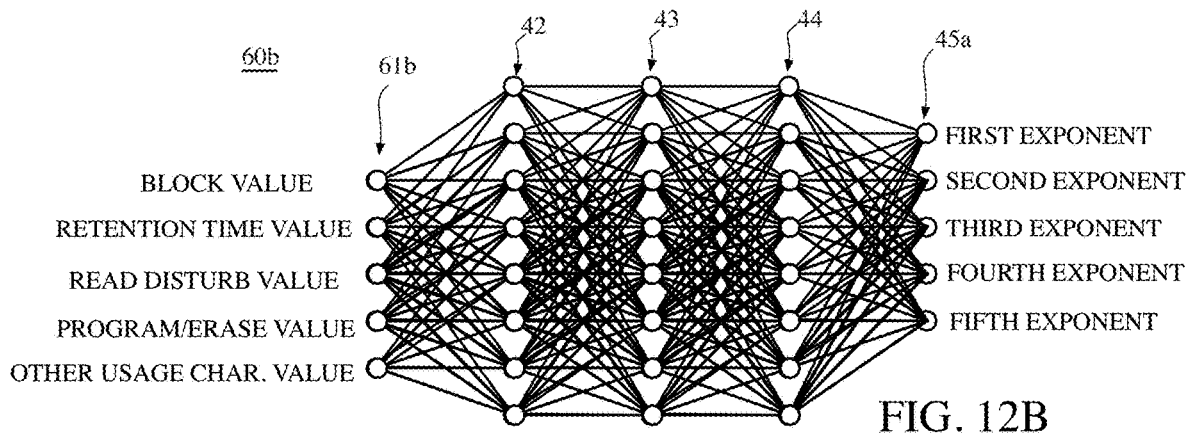

In one example wordlines are grouped and an RNN inference model is generated for each of a plurality of groups of wordlines (that may be referred to as "W-categorized RNN inference models"). In this example, each of the W-categorized RNN inference models are stored in step 102 on the flash controller and a W-categorized RNN inference model is selected in step 104 corresponding to the wordlines that is to be read in step 107. For example, a grouping table 15 can be stored in data storage 4 that includes wordline values and corresponding values or pointers identifying the particular W-categorized RNN inference model to be used. In step 104 a lookup operation is performed on the wordline table using the wordline that is to be read in step 107 to identify the W-categorized RNN model to use. A W-categorized RNN inference model 60b is shown in FIG. 12B. Since W-categorized RNN inference model 60b corresponds to a particular wordline group, it does not include a wordline value as an input to input neurons 61b.

In one example, wordlines are grouped by their physical location on the chip (e.g., wordlines of the first n layers are a first category, and wordlines of the next n layers are a second category, and so on), with wordlines divided into ten different wordline categories such that 10 W-categorized RNN inference models are stored in step 102.

C. Wordline and Period Grouping

Figure 12C:
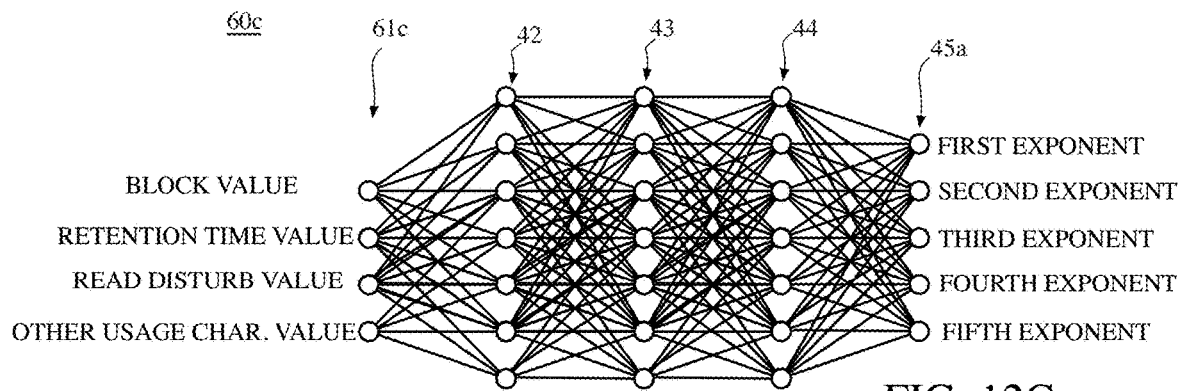

In one example wordlines are grouped and the lifetime of the flash memory device is grouped into periods based on the number of program and erase cycles, and an RNN inference model is generated for each of a plurality of groups of wordlines and each of a plurality of periods in the lifetime of the flash memory device (that may be referred to as "W-P/E-categorized RNN inference models"). In this example, each of the W-P/E-categorized RNN inference models are stored in step 102 on the flash controller and a W-P/E-categorized RNN inference model is selected in step 104 corresponding to the wordline that is to be read in step 107 and the current time period. For example, a grouping table 15 can be stored in data storage 4 that includes wordline values, program/erase values and corresponding values identifying the particular W-P/E-categorized RNN inference model to be used. In step 104 a lookup operation is performed on W-P/E table using the wordline that is to be read in step 107 and a program/erase value corresponding to the current number of program/erase cycles for the block that is to be read in step 107 to identify the W-P/E-categorized RNN inference model to use. A W-P/E-categorized RNN inference model 60c is shown in FIG. 12C. Since W-P/E-categorized RNN inference model 60c correspond to a particular wordline group and a particular time period, it does not include a wordline value or a program/erase value as input to input neurons 61c.

In one example, wordlines are grouped by their physical location on the chip into ten different wordline categories as discussed in example B above and the lifetime of the flash memory device is divided into seven different periods as discussed in example A above, such that 70 W-P/E-categorized RNN inference models are stored in step 102.

D. Block Grouping

Figure 12D:
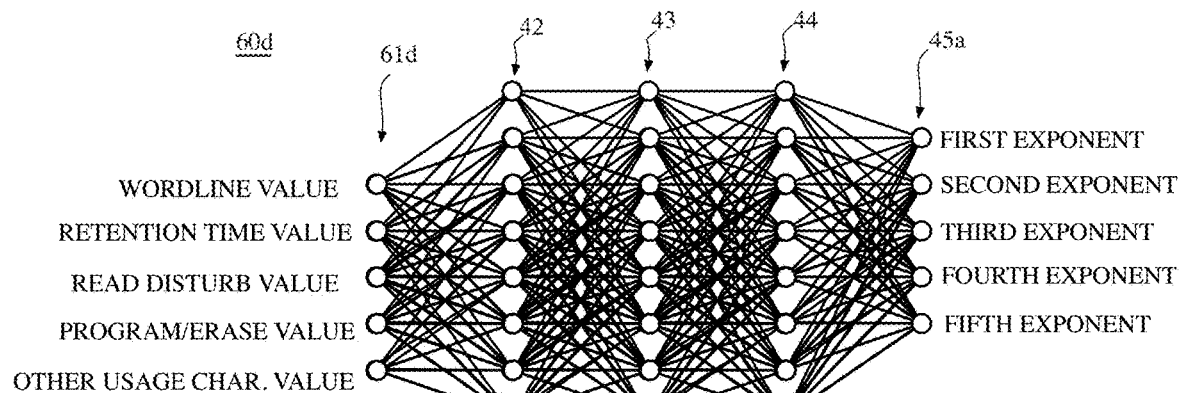

In one example blocks are grouped and an RNN inference model is generated for each of a plurality of groups of blocks (that may be referred to as "B-categorized RNN inference models"). In this example, each of the B-categorized RNN inference models are stored in step 102 on the flash controller and a B-categorized RNN inference model is selected in step 104 corresponding to the block value of the block that is to be read in step 107. For example, a grouping table 15 can be stored in data storage 4 that includes block values and corresponding values or pointers identifying the particular B-categorized RNN inference model to be used. In step 104 a lookup operation is performed on the block table using the block value of the block that is to be read in step 107 to identify the B-categorized RNN inference model to use. A B-categorized RNN inference model 60d is shown in FIG. 12D. Since B-categorized RNN inference model 60d corresponds to a particular block group, it does not have a block value as an input to input neurons 61d.

In one example, the block categories group blocks by their physical location on the chip (e.g., n adjoining blocks are a first category, then the next n adjoining blocks are a second category, and so on), with blocks divided into ten different block groups such that 10 B-categorized RNN inference models are stored in step 102.

E. Block and Period Grouping

In one example blocks are grouped and the lifetime of the flash memory device is grouped into periods based on the number of program and erase cycles, and an RNN inference model is generated for each of a plurality of groups of blocks and each of a plurality of periods in the lifetime of the flash memory device (that may be referred to as "B-P/E-categorized RNN inference models"). In this example, each of the B-P/E-categorized RNN inference models are stored in step 102 on the flash controller and a B-P/E-categorized RNN inference model is selected in step 104 corresponding to the block value of the block that is to be read in step 107 and the current time period. For example, a grouping table 15 can be stored in data storage 4 that includes block values, program/erase values and corresponding values identifying the particular BP/E-categorized RNN inference model to be used.

Figure 12E:
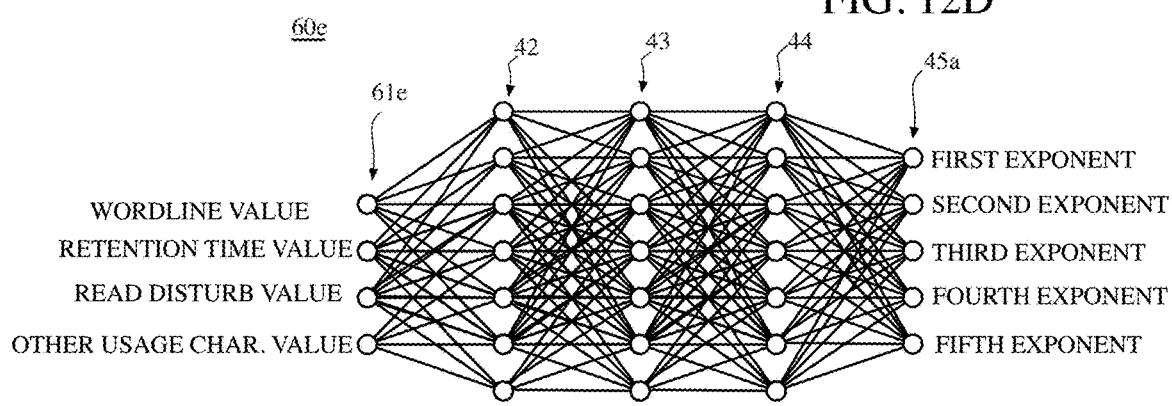

In step 104 a lookup operation is performed on the BP/E table using the block value of the block that is to be read in step 107 and the program/erase value for the block that is to be read in step 107 to identify the B-P/E-categorized RNN interference model to use. A B-P/E-categorized RNN inference model 60e is shown in FIG. 12E. Since B-P/E-categorized RNN inference model 60e corresponds to a particular block group and a particular time period, it does not have a block value or a program/erase value as input to input neurons 61e.

In one example, the block categories group blocks by their physical location on the chip into ten different block groups as discussed in example D above and the lifetime of the flash memory device is divided into seven different periods as discussed in example A above, such that 70 B-P/E-categorized RNN inference models are stored in step 102.

F. Block and Wordline and Period Grouping

Figure 12F:
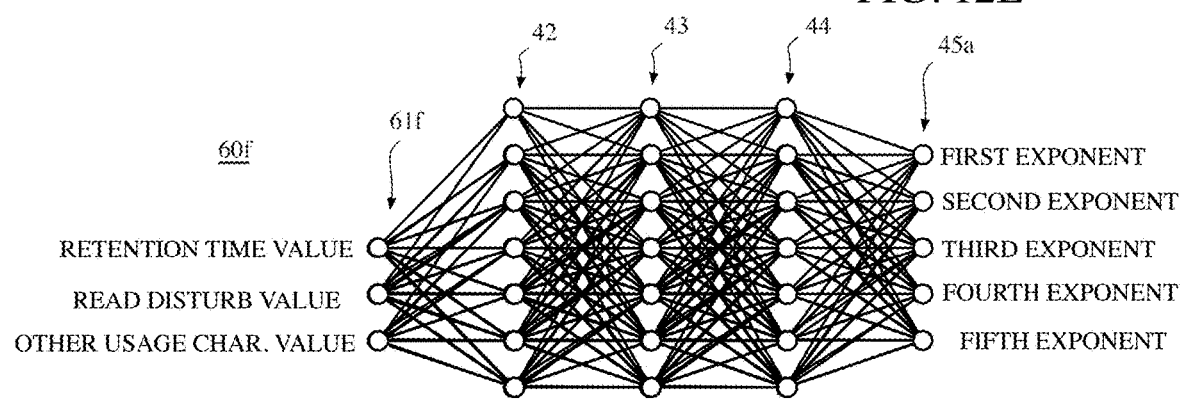

In one example blocks and wordlines are grouped; and the lifetime of the flash memory device is grouped into periods based on the number of program and erase cycles; and an RNN inference model is generated for each of a plurality of groups of blocks, for each of a plurality of groups of wordlines and for each of a plurality of periods in the lifetime of flash memory device (that may be referred to as "B-W-P/E-categorized RNN inference models"). In this example, each of the B-W-P/E-categorized RNN inference models are stored in step 102 on the flash controller and a B-W-P/E-categorized RNN inference model is selected in step 104 corresponding to the block value of the block that is to be read in step 107, the wordline that is to be read in step 107 and the current time period. For example, a grouping table 15 can be stored in data storage 4 that includes block values, wordline values, program/erase values and corresponding values identifying the particular B-W-P/E-categorized RNN inference model to be used. In step 104 a lookup operation is performed on the B-W-P/E table using the block value of the block that is to be read in step 107, the wordline that is to be read in step 107 and the current number of P/E cycles for the block that is to be read in step 107 to identify the B-W-P/E-categorized RNN inference model to use. A B-W-P/E-categorized RNN inference model 60f is shown in FIG. 12F. Since B-W-P/E-categorized RNN inference model 60f corresponds to a particular block group, a particular wordline group and a particular time period, the B-W-P/E-categorized RNN inference model 60f will not have the block value, a wordline value or a program/erase value as input to input neurons 61f.

In one example, wordlines are grouped by their physical location on the chip into ten different wordline groups as discussed above in example B, blocks are grouped into ten groups by their physical location on the chip as discussed in example D above and the lifetime of the flash memory device is divided into seven different periods as discussed in example A above, such that 700 B-W-P/E-categorized RNN inference models are stored in step 102.

G. Retention Time Grouping

Figure 12G:
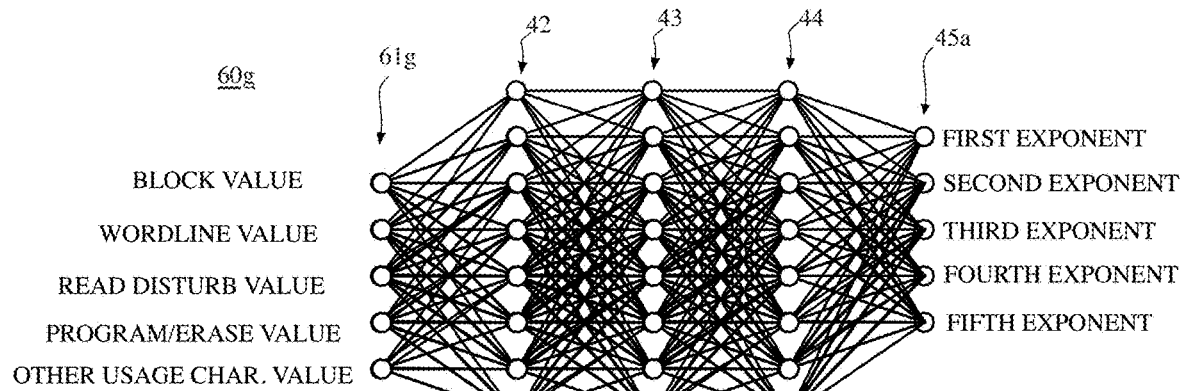

In one example retention times are grouped and an RNN inference model is generated for each of a plurality of groups of retention times (that may be referred to as "RT-categorized RNN inference models"). In this example, each of the RT-categorized RNN inference models are stored in step 102 on the flash controller and a RT-categorized RNN inference model is selected in step 104 corresponding to the closed-block retention time for the block that is to be read in step 107. For example, a retention time (RT) table can be stored in data storage 4 that includes closed-block retention time values and corresponding values identifying the particular RT-categorized RNN inference model to be used. In step 104 a lookup operation is performed on the retention time table using the current closed-block retention time for the block that is to be read in step 107 to identify the RT-categorized RNN inference model to use. A RT-categorized RNN inference model 60g is shown in FIG. 12G. Since RT-categorized RNN inference model 60g corresponds to a particular retention time group, it does not have a retention time value as an input to input neurons 61g.

In one example, the retention time is grouped into different periods based on closed-block retention time, with some or all periods having the same duration. In one example retention time is grouped into 50 periods, with each period having a duration of 40 hours (e.g., a first group has a closed-block retention time less than or equal to 40 hours, a second group has a closed-block retention time of greater than 40 hours and less than or equal to 80 hours, a third group has a closed-block retention time of greater than 80 hours and less than or equal to 120 hours, and so on) such that 50 RT-categorized RNN inference models are stored in step 102.

H. Retention Time and Period Grouping

Figure 12H:
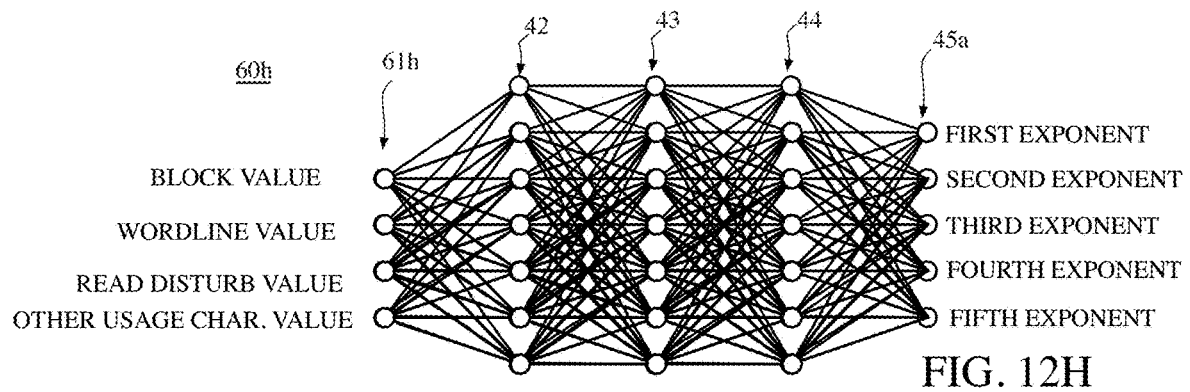

In one example, retention time and the lifetime of the flash memory device is grouped into periods based on the number of program and erase cycles, and an RNN inference model is generated for each of a plurality of groups of retention times and each of a plurality of periods in the lifetime of the flash memory device (that may be referred to as "RT-P/E-categorized RNN inference models"). In this example, each of the RT-P/E-categorized RNN inference models are stored in step 102 on the flash controller and a RT-P/E-categorized RNN inference model is selected in step 104 corresponding to the closed-block retention time of the block that is to be read in step 107 and the current time period. For example, a grouping table 15 can be stored in data storage 4 that includes retention time values, program/erase values and corresponding values or pointers identifying the particular RT-P/E-categorized RNN inference model to be used. In step 104 a lookup operation is performed on the grouping table 15 using the current closed-block retention time of the block that is to be read in step 107 and the current number of program and erase cycles of the block that is to be read in step 107 to identify the RT-P/E-categorized RNN model to use. A RT-P/E-categorized RNN inference model 60h is shown in FIG. 12H. Since RT-P/E-categorized RNN inference model 60h correspond to a particular retention time group and a particular time period, it does not have retention time or the number of program/erase values as input to input neurons 61h.

In one example retention time is grouped into 50 different periods based on closed-block retention time as discussed in example G above and the lifetime of the flash memory device is divided into seven different periods as discussed in example A above such that 350 RT-P/E-categorized RNN inference models are stored in step 102.

I. Read Disturb Grouping

Figure 12I:
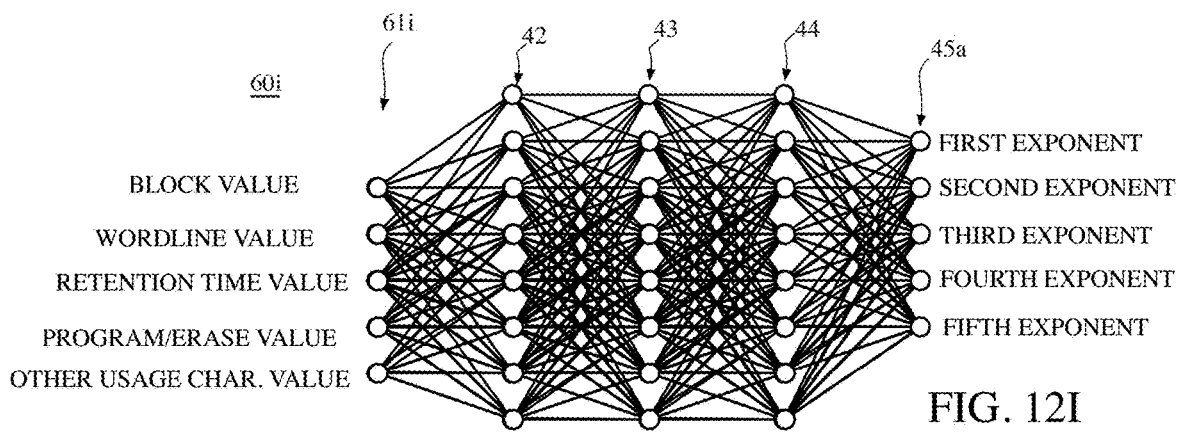

In one example read disturbs are grouped and an RNN inference model is generated for each of a plurality of groups of read disturbs (that may be referred to as "RD-categorized RNN inference models"). In this example, each of the RD-categorized RNN inference models are stored in step 102 on the flash controller and a RD-categorized RNN inference model is selected in step 104 corresponding to the current number of read disturbs for the block that is to be read in step 107. For example, a grouping table 15 can be stored in data storage 4 that includes read disturb values and corresponding values or pointers identifying the particular RD-categorized RNN inference model to be used. In step 104 a lookup operation is performed on the grouping table 15 using the current number of closed-block reads of the block that is to be read in step 107 to identify the RD-categorized RNN inference model to use. A RD-categorized RNN inference model 60*i* is shown in FIG. 12I. Since RD-categorized RNN inference model 60*i* correspond to a particular read disturb group, it does not have a read disturb value as an input to input neurons 61*i*.

In one example read disturb is categorized based the number of closed-block reads of the block of that is to be read in step 107, with a first category including from 0 to 100,000 closed-block reads, a second category including from 100,001 to 200,000 closed-block reads, a third category including from 200,001 to 300,000 closed-block reads, a fourth category that is more than 300,001 closed-block reads such that 4 RD-categorized RNN inference models are stored in step 102.

J. Read Disturb and Period Grouping

Figure 12J:
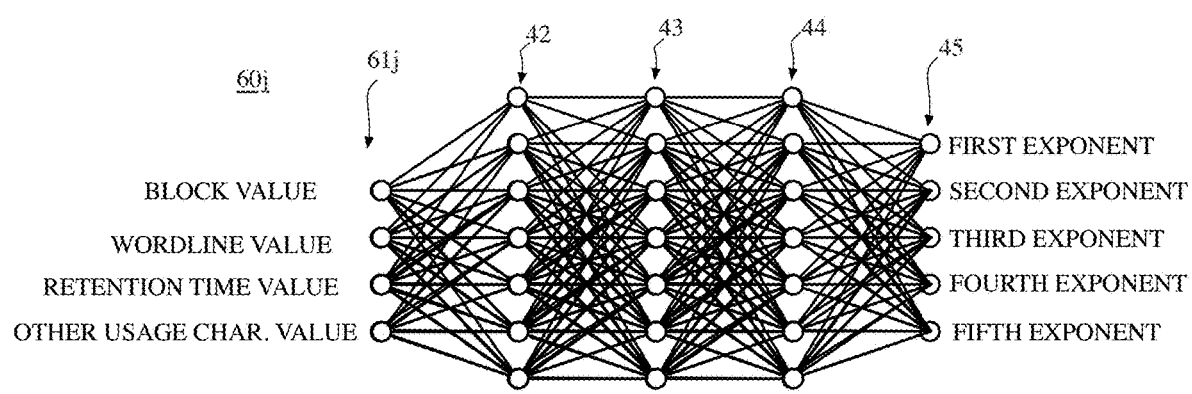

In one example read disturbs are grouped; the lifetime of the flash memory device is grouped into periods based on the number of program and erase cycles; and an RNN inference model is generated for each of a plurality of groups of read disturbs and each of a plurality of periods in the lifetime of the flash memory device (that may be referred to as "RD-P/E-categorized RNN inference models"). In this example, each of the RD-P/E-categorized RNN inference models are stored in step 102 on the flash controller and a RD-P/E-categorized RNN inference model is selected in step 104 corresponding to the current number of closed-block reads of the block that is to be read in step 107 and the current time period. For example, a grouping table 15 could be stored in data storage 4 that includes read disturb values, program/erase values and corresponding values or pointers identifying the particular RD-P/E-categorized RNN inference model to be used. In step 104 a lookup operation is performed on the grouping table 15 using the current number of closed-block reads of the block that is to be read in step 107 and the program/erase value corresponding to the current number of program and erase cycles of the block that is to be read in step 107 to identify the RD-P/E-categorized RNN inference model to use. A RD-P/E-categorized RNN inference model 60*j* is shown in FIG. 12J. Since RD-P/E-categorized RNN inference model 60*j* correspond to a particular read disturb group and a particular time period, the RD-P/E-categorized RNN inference model will not have read disturb value or program/erase value as input to input neurons 61*jj*.

In one example read disturb is grouped into 4 different groups as discussed in example I above and the lifetime of the flash memory device is divided into seven different periods as discussed in example A above such that 28 RD-P/E-categorized RNN inference models are stored in step 102

K. Retention Time and Read Disturb Grouping

In one example retention times and read disturbs are grouped and an RNN inference model is generated for each of a plurality of groups of retention times and generated for each of a plurality of groups of read disturbs (that may be referred to as "RT-RD-categorized RNN inference models").

In one example retention time is grouped into 50 groups and as discussed in example G and read disturb is grouped into 4 different groups as discussed in example I such that 200 RT-RD-categorized RNN inference models are stored in step 102.

L. Retention Time, Block and Read Disturb Grouping

In one example, retention times, blocks and read disturbs are grouped and an RNN inference model is generated for each of a plurality of groups of retention times, for each of a plurality of groups of blocks and for each of a plurality of groups of read disturbs (that may be referred to as "RT-B-RD-categorized RNN inference models").

In one example retention time is grouped into 50 groups and as discussed in example G, blocks are grouped into 10 groups as discussed in example D and read disturb is grouped into 4 different groups as discussed in example I such that 2000 RT-B-RD-categorized RNN inference models are stored in step 102.

M. Retention Time, Wordline and Read Disturb Grouping

In one example, retention times, wordlines and read disturbs are grouped and an RNN inference model is generated for each of a plurality of groups of retention times, for each of a plurality of groups of wordlines and for each of a plurality of groups of read disturbs (that may be referred to as "RT-W-RD-categorized RNN inference models").

In one example retention time is grouped into 50 groups and as discussed in example G, wordlines are grouped into 10 groups as discussed in example B and read disturb is grouped into 4 different groups as discussed in example I such that 2000 RT-W-RD-categorized RNN inference models are stored in step 102.

N. Retention Time, Wordline, Read Disturb and Period Grouping

In one example, retention times, wordlines, read disturbs are grouped; the lifetime of the flash memory device is grouped into periods based on the number of program and erase cycles; and an RNN inference model is generated for each of a plurality of groups of retention times, for each of a plurality of groups of wordlines, for each of a plurality of groups of read disturbs and for each of a plurality of periods in the lifetime of the flash memory device (that may be referred to as "RT-W-RD-P/E-categorized RNN inference models").

In one example retention time is grouped into 50 groups and as discussed in example G, wordlines are grouped into 10 groups as discussed in example B and read disturb is grouped into 4 different groups as discussed in example I and P/E cycles are divided into 7 periods as discussed in example A such that 14,000 RT-W-RD-P/E-categorized RNN inference models are stored in step 102.

Though the above examples A-N and FIGS. 12A-12J were described above as generating output in the form of coefficients of the TVS-RE curve, alternatively the output neurons generate output values that indicate the amount of error at different TVSO values as shown in FIG. 4B.

The method and apparatus of the present invention models multiple factors that affect LIBER and generates, on the flash controller, a TVS-RE curve that accurately reflects the physical characteristics of the location that is to be read, both the structural characteristics of the location that is to be read (e.g., the wordline and the block that is to be read), the current age/physical degradation of the location that is to be read (e.g., the number of P/E cycles) and the current transitory characteristics of the location that is to be read (e.g., closed-block read disturb and closed-block retention time). Because the generated TVS-RE curve accurately represents the factors that affect UBER, the generated TVSO value corresponding to the minimum value of the TVS-RE curve will be the appropriate TVSO value for performing the read (corresponding to the TVSO value that provides a minimum number of errors during device characterization). Using the a TVSO value for performing the read results in a reduced number of read errors at the flash controller. The reduced number of read errors of the method and apparatus of the present invention effectively maintains UBER within acceptable levels during the lifetime of the SSD.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What is claimed is:

1. A method for reading a flash memory device comprising:
    storing a plurality of Regression Neural Network (RNN) inference models on a flash controller that is coupled to the flash memory device or on a memory device that is coupled to the flash controller, respective RNN inference models of the plurality of RNN inference models identifying a threshold-voltage-shift read-error curve for different periods in the lifetime of the flash memory device, respective threshold-voltage-shift read-error curves identifying a number of errors as a function of threshold voltage shift offset values;
    monitoring an operation of a flash memory device to identify one or more usage characteristic values of the flash memory device, the monitoring including monitoring the operation of the flash memory device to determine a current period in the lifetime of the flash memory device;
    selecting one of the plurality of RNN inference models corresponding to the determined current period in the lifetime of the flash memory device;
    performing a neural network operation of the selected one of the stored RNN inference models to generate a threshold-voltage-shift read-error curve corresponding to the identified usage characteristic values, an input for the neural network operation including the identified one or more usage characteristic values;
    identifying a threshold voltage shift offset value corresponding to a minimum value of the generated threshold-voltage-shift read-error curve; and
    performing a read of the flash memory device using a threshold-voltage-shift read at the identified threshold voltage shift offset value.

2. The method of claim 1 wherein the input for the neural network operation includes one or more values identifying a page that is to be read.

3. The method of claim 1, wherein a value identifying a current point in the lifetime of the flash memory device is a number of program and erase cycles.

4. The method of claim 1, wherein the monitoring the operation of the flash memory device comprises counting a number of program and erase cycles of respective blocks of the flash memory device, the determined current period in the lifetime of the flash memory device comprising the counted number of program and erase cycles of a block containing a page that is to be read.

5. The method of claim 1 wherein the monitoring operation of the flash memory device comprises counting a number of closed-block reads, the input for the neural network operation including a value indicating the counted number of closed block reads of a block containing a page that is to be read.

6. The method of claim 1 wherein the monitoring the operation of the flash memory device comprises determining a closed-block retention time, the input for the neural network operation including a value indicating the determined closed-block retention time of a block containing a page that is to be read.

7. The method of claim 1 comprising: generating the RNN inference model, the RNN inference model configured for performing a regression to identify coefficients of the at least one threshold-voltage-shift read-error curve.

8. A method for reading a flash memory device comprising:
    generating a Regression Neural Network (RNN) inference model, the RNN inference model for performing a regression to identify coefficients of at least one threshold-voltage-shift read-error curve, the at least one threshold-voltage-shift read-error curve identifying a number of errors as a function of threshold voltage shift offset values, wherein the generating the RNN inference model comprises:
        receiving as input one or more configuration files defining an initial RNN inference model,
        receiving as input one or more sets of threshold-voltage-shift read test results,
        creating a threshold-voltage-shift-read training data set, a threshold-voltage-shift-read validation data set and a threshold-voltage-shift-read test data set from the received input of one or more sets of threshold-voltage-shift read test results,
        performing a smoothing function on the threshold-voltage-shift read training data set to obtain a smoothed threshold-voltage-shift read training data set,
        training the initial RNN inference model using the smoothed threshold-voltage-shift read training data set to obtain a trained RNN inference model,
        validating the trained RNN inference model using the threshold-voltage-shift-read validation data set,
        and testing the trained and validated RNN inference model using the threshold-voltage-shift read test data set;
    storing RNN inference model on a flash controller that is coupled to the flash memory device or on a memory device that is coupled to the flash controller;
    monitoring the an operation of a flash memory device to identify one or more usage characteristic values of the flash memory device;
    performing a neural network operation of the stored RNN inference model to generate a threshold-voltage-shift read-error curve corresponding to the identified usage characteristic values, an input of the neural network operation including the identified one or more usage characteristic values;
    identifying a threshold voltage shift offset value corresponding to a minimum value of the generated threshold-voltage-shift read-error curve, and performing a read of the flash memory device using a threshold-voltage-shift read at the identified threshold voltage shift offset value.

9. A method for reading a flash memory device comprising:
    storing a plurality of Regression Neural Network (RNN) inference models on a flash controller that is coupled to the flash memory device or on a memory device that is coupled to the flash controller, respective RNN inference models of the plurality of RNN inference models identifying one or more threshold-voltage-shift read-error curves that identify a number of errors as a function of threshold voltage shift offset values, respective threshold-voltage-shift read-error curves corresponding to one or more grouping of factors selected from the group consisting of a group of wordlines of the flash memory device, a group of blocks of the flash memory device, periods of time, a group of read disturbs and a group of retention times;

monitoring the operation of a flash memory device to identify one or more usage characteristic values of the flash memory device;

selecting one of the plurality of RNN inference models;

performing a neural network operation of the selected RNN inference model to generate a threshold-voltage-shift read-error curve corresponding to the identified usage characteristic values, an input for the neural network operation including the identified one or more usage characteristic values;

identifying a threshold voltage shift offset value corresponding to a minimum value of the generated threshold-voltage-shift read-error curve; and performing a read of the flash memory device using a threshold-voltage-shift read at the identified threshold voltage shift offset value.

10. The flash controller of claim 9, wherein the input for the neural network operation includes one or more values identifying a page that is to be read.

11. A flash controller including a write circuit, a read circuit configured to perform a read of a flash memory device using a threshold-voltage-shift read operation and a decoder configured to decode results of the read, the flash controller comprising:

a status circuit to monitor an operation of the flash memory device to identify one or more usage characteristic values;

data storage to store a plurality of Regression Neural Network (RNN) inference models that identify one or more threshold-voltage-shift read-error curves, the threshold-voltage-shift read-error curves identifying a number of errors as a function of threshold voltage shift offset values, respective RNN inference models of the plurality of RNN inference models corresponding to one or more grouping of factors selected from the group consisting of a group of wordlines of the flash memory device, a group of blocks of the flash memory device, periods of time, a group of read disturbs and a group of retention times;

a neural processor comprising at least one of hardware, software and firmware, the neural processor coupled to the data storage, the neural processor to select one of the plurality of stored RNN inference models and perform a neural network operation on the selected RNN inference model to generate a threshold-voltage-shift read-error curve corresponding to the identified usage characteristic values, an input for the neural network operation including the identified one or more usage characteristic values; and a minimum function module comprising at least one of hardware, software and firmware, the minimum function module coupled to the neural processor, the minimum function module to determine a minimum value for the generated threshold-voltage-shift read-error curve and identify a threshold voltage shift offset value corresponding to the determined minimum value, wherein the threshold-voltage-shift read operation uses the identified threshold voltage shift offset value to perform the read.

12. The flash controller of claim 11 wherein respective RNN inference models of the plurality of RNN inference models identify threshold-voltage-shift read-error curves for a group of wordlines of the flash memory device, Wherein the neural processor is to select the one of the plurality of RNN inference models corresponding to a wordline of the read that is to be performed.

13. The flash controller of claim 11 wherein respective RNN inference models of the plurality of RNN inference models identify threshold-voltage-shift read-error curves for a group of blocks of the flash memory device, wherein the neural processor is to select the one of the plurality of RNN inference models corresponding to a block of the read that is to be performed.

14. The flash controller of claim 11 wherein respective RNN inference models of the plurality of RNN inference models identify threshold-voltage-shift read-error curves for a group of read disturbs of the flash memory device, wherein the neural processor is to select the one of the plurality of RNN inference models corresponding to a number of closed-block reads for a block of the page that is to be read.

15. A Solid State Drive (SSD) comprising:

a plurality of flash memory devices;

a flash controller that is coupled to the flash memory devices, the flash controller comprising:

a write circuit to program codewords into respective flash memory devices of the plurality of flash memory devices;

a read circuit to perform a read of the flash memory devices using a threshold-voltage-shift read operation;

a decoder coupled to the read circuit, the decoder to decode results of the read;

a status circuit for monitoring an operation of the flash memory devices to identify, for each flash memory device one or more usage characteristic values;

a data storage to store a plurality of Regression Neural Network (RNN) inference models that identify one or more threshold-voltage-shift read-error curves, the threshold-voltage-shift read-error curves identifying a number of errors as a function of threshold voltage shift offset values, respective RNN inference models of the plurality of RNN inference models identifying threshold-voltage-shift read-error curves for one or more of a group of wordlines of the flash memory device, a group of blocks of the flash memory device, periods of time, a group of read disturbs and a group of retention times;

a neural processor comprising at least one of hardware software and firmware, the neural processor coupled to the data storage, the neural processor to select one of the plurality of stored RNN inference models, and to perform a neural network operation of the selected RNN inference model to generate a threshold-voltage-shift read-error curve corresponding to the identified usage characteristic values, an input for the neural network operation including the identified one or more usage characteristic values; and a minimum function module comprising at least one of hardware, software and firmware, the minimum function module coupled to the neural processor, the minimum function module to determine a minimum value for the generated threshold-voltage-shift read-error curve and identify a threshold voltage shift offset value corresponding to the determined minimum value, wherein the threshold-voltage-shift read operation uses the identified threshold voltage shift offset value to perform the read.

* * * * *

UNITED STATES PATENT AND TRADEMARK OFFICE
CERTIFICATE OF CORRECTION

PATENT NO. : 12,175,363 B2
APPLICATION NO. : 17/089891
DATED : December 24, 2024
INVENTOR(S) : Lorenzo Zuolo and Rino Micheloni Page 1 of 1

It is certified that error appears in the above-identified patent and that said Letters Patent is hereby corrected as shown below:

In the Specification

Column 4, Line 54, replace "RB" with --R/B--;
Column 20, Line 50, replace "LIBER" with --UBER--;

In the Claims

Claim 8, Column 22, Line 45, replace "storing RNN" with --storing the RNN--;
Claim 8, Column 22, Line 48, replace "the an" with --an--; and
Claim 12, Column 24, Line 8, replace "Wherein" with --wherein--.

Signed and Sealed this
Sixth Day of May, 2025

Coke Morgan Stewart
*Acting Director of the United States Patent and Trademark Office*